US009478682B2

(12) United States Patent
Kirihara et al.

(10) Patent No.: US 9,478,682 B2
(45) Date of Patent: Oct. 25, 2016

(54) IR SENSOR PACKAGE INCLUDING A COVER MEMBER AND A SENSOR CHIP RECESSED INTO THE PACKAGE BODY

(75) Inventors: Masao Kirihara, Osaka (JP); Hiroshi Yamanaka, Mie (JP); Yoshiharu Sanagawa, Osaka (JP); Takanori Aketa, Osaka (JP); Yushi Nakamura, Mie (JP); Mitsuhiko Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 167 days.

(21) Appl. No.: 13/806,111

(22) PCT Filed: Jun. 23, 2011

(86) PCT No.: PCT/JP2011/064435
§ 371 (c)(1),
(2), (4) Date: Dec. 20, 2012

(87) PCT Pub. No.: WO2011/162346
PCT Pub. Date: Dec. 29, 2011

(65) Prior Publication Data
US 2013/0093037 A1    Apr. 18, 2013

(30) Foreign Application Priority Data
Jun. 24, 2010 (JP) ................. 2010-144176

(51) Int. Cl.
*H01L 31/0232* (2014.01)
*H01L 31/024* (2014.01)
(Continued)

(52) U.S. Cl.
CPC ............ *H01L 31/024* (2013.01); *G01J 5/04* (2013.01); *G01J 5/045* (2013.01); *G01J 5/06* (2013.01); *G01J 5/08* (2013.01); *G01J 5/0806* (2013.01); *G01J 5/0831* (2013.01); *G01J 5/12* (2013.01); *H01L 2924/0002* (2013.01)

(58) Field of Classification Search
CPC ........ G01J 5/045; G01J 5/065; G01J 5/0831; G01J 5/12; H01L 31/023; H01L 31/024
USPC .................................................. 257/433, 435
See application file for complete search history.

(56) References Cited

U.S. PATENT DOCUMENTS 7,005,642 B2    2/2006  Nozu
2002/0170589 A1*  11/2002  Hamamoto et al. .......... 136/225
(Continued)

FOREIGN PATENT DOCUMENTS

JP    2003-149045 A    5/2003
JP    2003-344156 A    12/2003
(Continued)

OTHER PUBLICATIONS

International Search Report isued in International Application No. PCT/JP2011/064435 issued on Oct. 4, 2011.

*Primary Examiner* — Marcos D Pizarro
(74) *Attorney, Agent, or Firm* — McDermott Will & Emery LLP

(57) ABSTRACT

The infrared sensor includes: an infrared sensor chip in which a plurality of pixel portions each including a temperature-sensitive portion formed of a thermopile is disposed in an array on one surface side of a semiconductor substrate; and an IC chip that processes an output signal of the infrared sensor chip. A package includes a package main body on which the infrared sensor chip and the IC chip are mounted to be arranged side-by-side, and a package cover that has a lens transmitting infrared rays and is hermetically bonded to the package main body. The package is provided therein with a cover member that includes a window hole through which infrared rays pass into the infrared sensor chip and equalizes amounts of temperature change of hot junctions and cold junctions among the pixel portions, the temperature change resulting from heating of the IC chip.

20 Claims, 20 Drawing Sheets

(51) Int. Cl.
*G01J 5/04* (2006.01)
*G01J 5/06* (2006.01)
*G01J 5/08* (2006.01)
*G01J 5/12* (2006.01)

(56) References Cited

U.S. PATENT DOCUMENTS

| | | | |
|---|---|---|---|
| 2002/0175285 A1* | 11/2002 | Ito et al. | 250/338.3 |
| 2003/0222218 A1* | 12/2003 | Nozu | 250/338.1 |
| 2011/0175100 A1 | 7/2011 | Tsuji et al. | |
| 2011/0175145 A1 | 7/2011 | Tsuji et al. | |
| 2012/0018636 A1 | 1/2012 | Tsuji | |
| 2012/0085907 A1 | 4/2012 | Tsuji | |

FOREIGN PATENT DOCUMENTS

| | | |
|---|---|---|
| JP | 2005-050974 A | 2/2005 |
| JP | 2010-078451 A | 4/2010 |
| WO | WO-2006/122529 A2 | 11/2006 |
| WO | WO-2010/035738 A1 | 4/2010 |
| WO | WO-2011/074678 A1 | 6/2011 |

* cited by examiner

FIG. 9
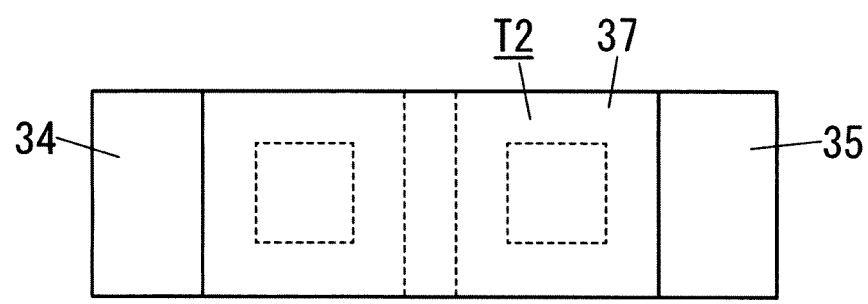
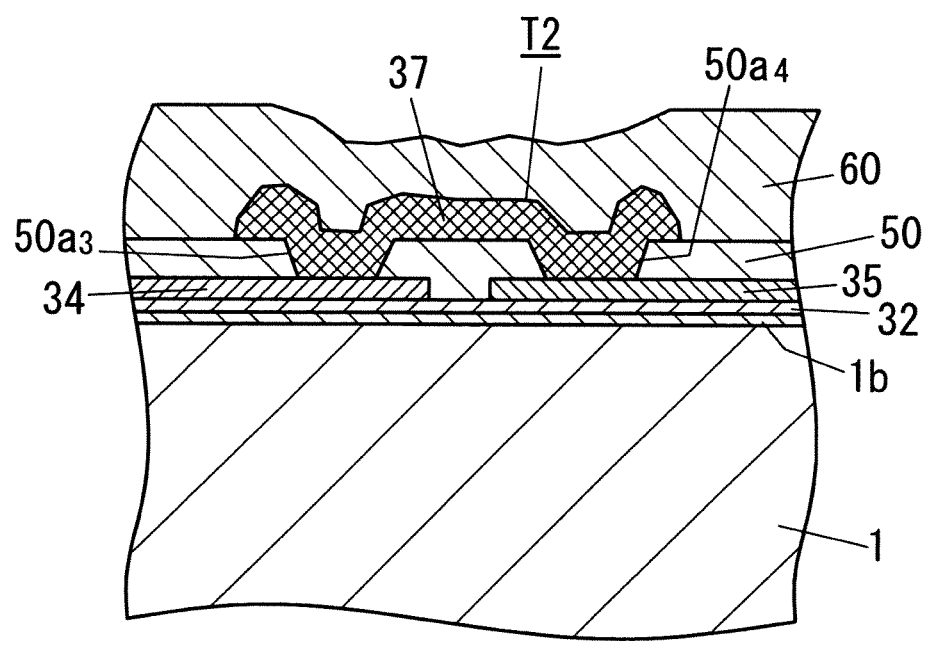

FIG. 10
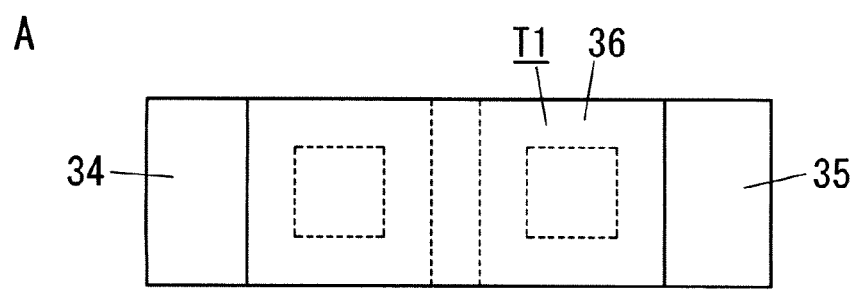
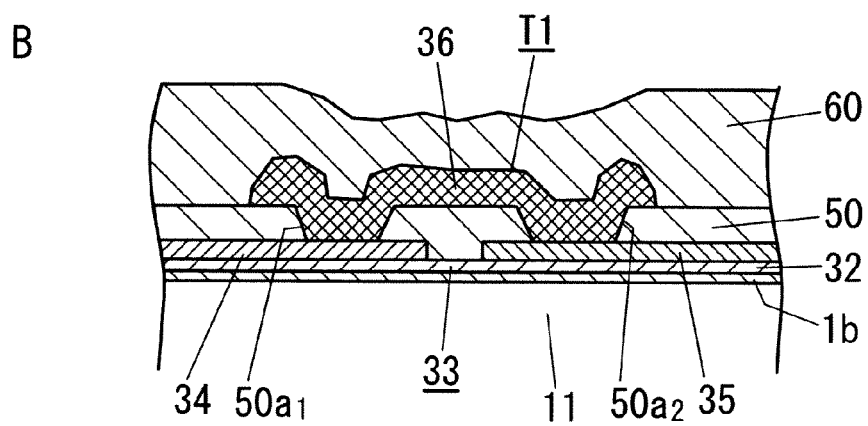
FIG. 11
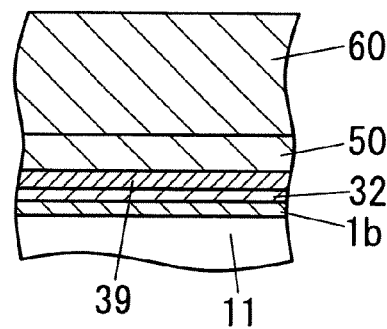

FIG. 13
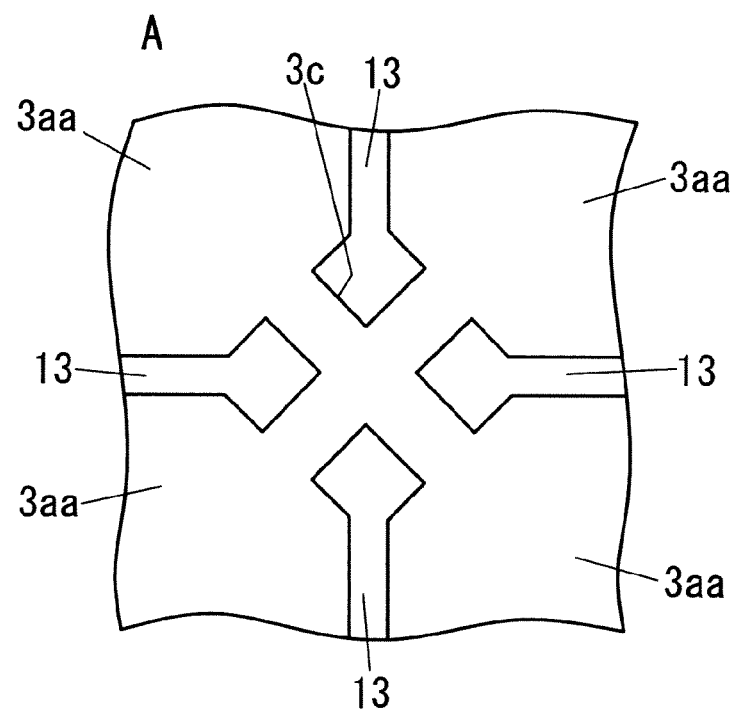
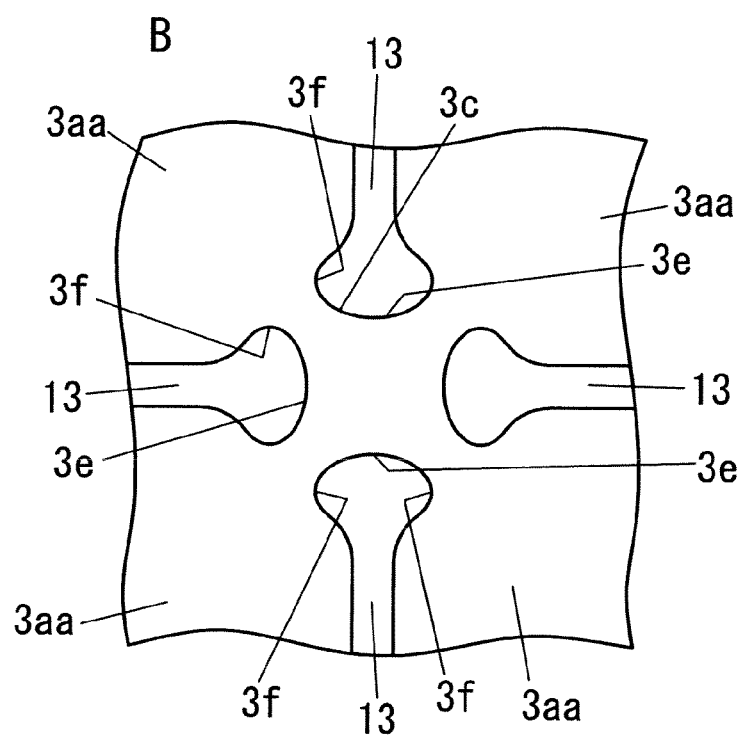

FIG. 15
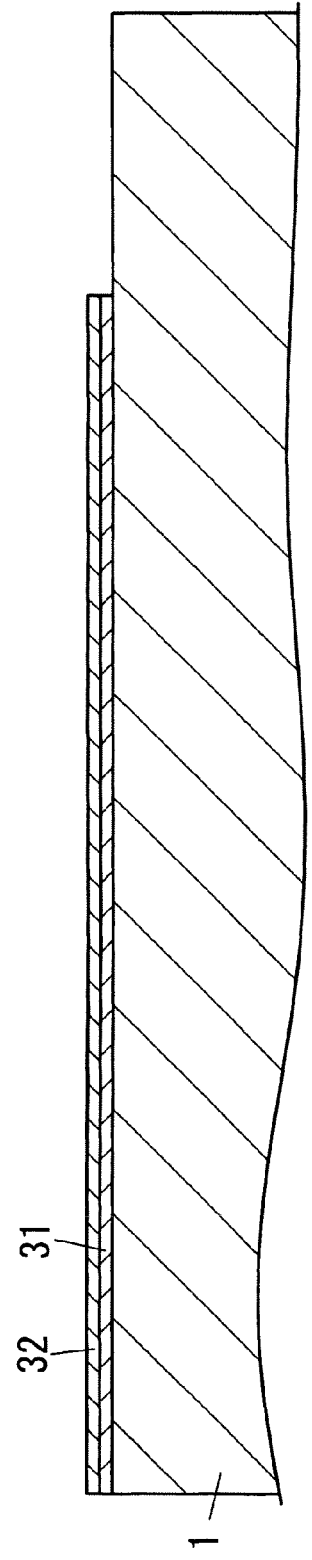
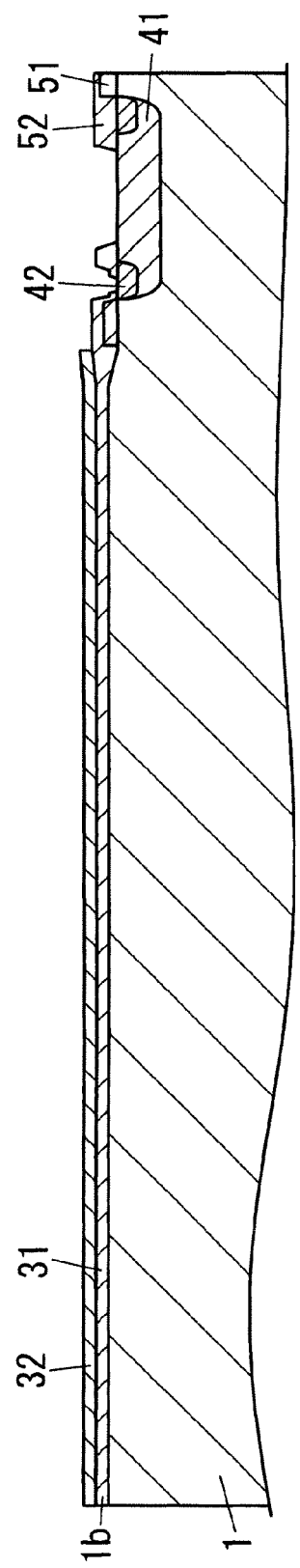

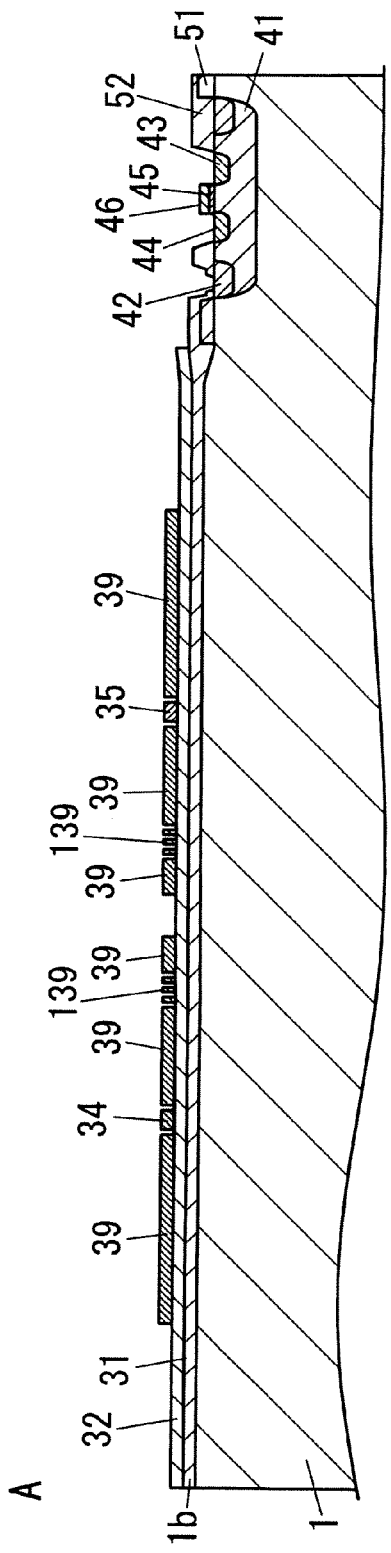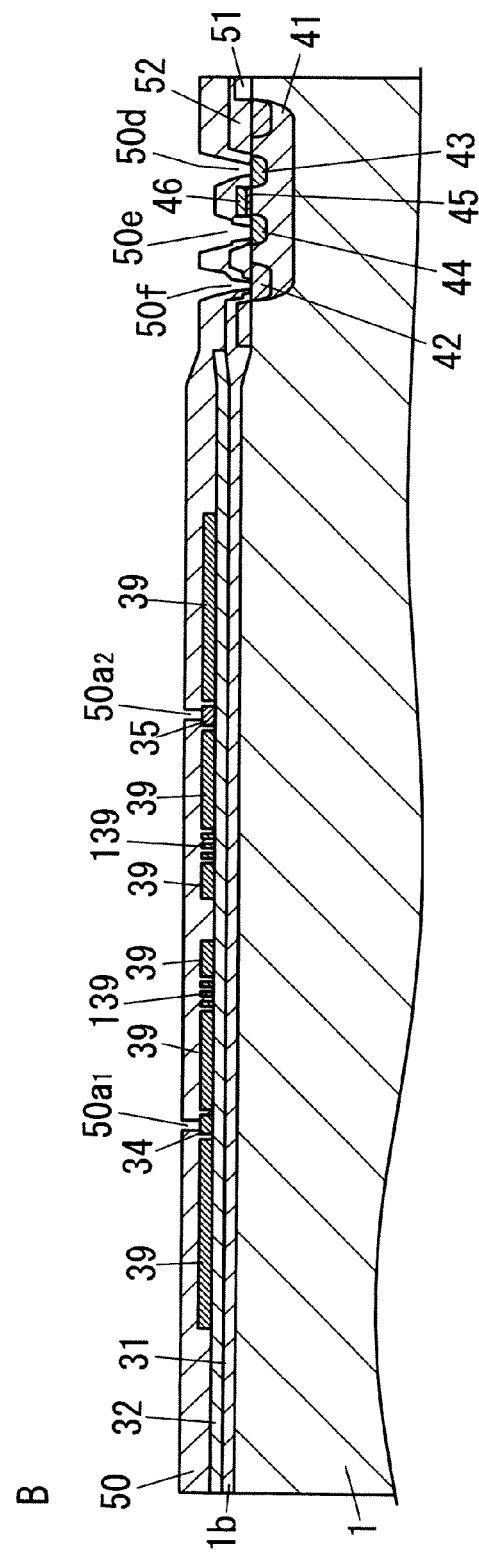
FIG. 16

IR SENSOR PACKAGE INCLUDING A COVER MEMBER AND A SENSOR CHIP RECESSED INTO THE PACKAGE BODY

RELATED APPLICATIONS

This application is the U.S. National Phase under 35 U.S.C. §371 of International Application No. PCT/JP2011/064435, filed on Jun. 23, 2011, which in turn claims the benefit of Japanese Application No. 2010-144176, filed on Jun. 24, 2010, the disclosures of which Applications are incorporated by reference herein.

TECHNICAL FIELD

The present invention relates to an infrared sensor.

BACKGROUND ART

In the past, there has been proposed an infrared sensor (infrared sensor module) that includes an infrared sensor chip in which a plurality of pixel portions each including a temperature-sensitive portion formed of a thermopile is disposed in an array on one surface of a silicon substrate, an IC chip that processes signals output from the infrared sensor chip, and a package in which the infrared sensor chip and the IC chip are accommodated (for example, see Japanese Patent Application Laid-open No. 2010-78451).

The package described above includes a package main body on which the infrared sensor chip and the IC chip are mounted to be arranged side-by side, and a package cover that is attached to the package main body so as to surround the infrared sensor chip and the IC chip by the package cover and the package main body. Here, the package cover includes a lens that focuses infrared rays to be detected by the infrared sensor chip. In short, the package cover has a function of transmitting infrared rays to be detected by the infrared sensor chip.

In the infrared sensor chip described above, a thermal infrared detector that includes the temperature-sensitive portion of each of the pixel portions is formed on the one surface side of the silicon substrate and is supported on the silicon substrate. Moreover, the infrared sensor chip has a cavity portion which is formed in the silicon substrate immediately below a part of the thermal infrared detector. Further, in the infrared sensor chip, a hot junction of the thermopile that forms the temperature-sensitive portion is formed in a region of the thermal infrared detector that overlaps the cavity portion, and a cold junction of the thermopile is formed in a region of the thermal infrared detector that does not overlap the cavity portion. Furthermore, in the infrared sensor chip, a MOS transistor of a switching element for pixel selection is provided correspondingly to each pixel portions. The MOS transistors are formed on the one surface side of the silicon substrate.

In the infrared sensor described above, since the infrared sensor chip and the IC chip are accommodated in one package, and the wire between the infrared sensor chip and the IC chip can be shortened, it is possible to reduce the influence of exogenous noise and improve noise tolerance.

However, in this infrared sensor, an offset voltage resulting from heating of the IC chip is included in the output signal (output voltage) of each of the pixel portions of the infrared sensor chip, and an S/N ratio varies among respective pixel portions. In short, the S/N ratio varies in a plane of the infrared sensor chip. Here, since the heat which is transferred from the IC chip to the silicon substrate of the infrared sensor chip through the package main body mainly increases the temperature of the cold junction, this heat becomes a factor that generates a negative offset voltage. On the other hand, since the heat which is transferred from the IC chip to the infrared sensor chip due to heat radiation or heat conduction via a medium (for example, nitrogen gas or the like) inside the package mainly increases the temperature of the hot junction, the heat becomes a factor that generates a positive offset voltage.

DISCLOSURE OF INVENTION

With the foregoing in view, it is an object of the present invention to provide an infrared sensor capable of suppressing variation in an S/N ratio in a plane of an infrared sensor chip resulting from heating of an IC chip.

An infrared sensor of the present invention includes: an infrared sensor chip in which a plurality of pixel portions each including a temperature-sensitive portion formed of a thermopile is disposed in an array on one surface side of a semiconductor substrate; an IC chip configured to process an output signal of the infrared sensor chip; and a package in which the infrared sensor chip and the IC chip are accommodated, wherein the package includes: a package main body on which the infrared sensor chip and the IC chip are mounted to be arranged horizontally; and a package cover which is hermetically bonded to the package main body so as to surround the infrared sensor chip and the IC chip by the package main body and the package cover, said package cover having a function of transmitting infrared rays to be detected by the infrared sensor chip, and the package is provided therein with a cover member which includes a window hole through which infrared rays pass into the infrared sensor chip, said cover member equalizing amounts of temperature change of hot junctions and cold junctions among the pixel portions, the amounts of temperature change corresponding to heating of the IC chip.

In the infrared sensor, it is preferable that the cover member is composed of: a front plate portion which is located on a front side of the infrared sensor chip and in which the window hole is formed; and a side plate portion which is extended toward a rear side from an outer circumferential edge of the front plate portion and is bonded to the package main body between the IC chip and the infrared sensor chip.

In the infrared sensor, it is preferable that the package main body is configured such that a surface of a second region on which the IC chip is mounted is more recessed than a surface of a first region on which the infrared sensor chip is mounted, the cover member includes: a front plate portion which is located on a front side of the infrared sensor chip and in which the window hole is formed; and two side plate portions which are extended toward a rear side from an outer circumferential edge of the front plate portion so as to be positioned on lateral sides of both side surfaces of the infrared sensor chip along an arrangement direction of the infrared sensor chip and the IC chip, and are bonded to the package main body, and the front plate portion is formed in such a size that the infrared sensor chip and the IC chip are fallen in a projection region of an outer circumferential line of the front plate portion.

In the infrared sensor, it is preferable that the cover member is configured such that the window hole of the front plate portion has a rectangular shape, and an inner circumferential line of the window hole closer to the IC chip is located closer to the IC chip than an outer circumferential line of the infrared sensor chip closer to the IC chip in a plan view.

In the infrared sensor, it is preferable that the cover member includes a front plate portion which is located on a front side of the infrared sensor chip and in which the window hole is formed, and a side plate portion which is extended toward a rear side from the front plate portion and is bonded to the package main body.

In the infrared sensor, it is preferable that the cover member is disposed in proximity to both the infrared sensor chip and the IC chip.

In the infrared sensor, it is preferable that the front plate portion is formed in such a size that at least the infrared sensor chip is fallen in a projection region of an outer circumferential line of the front plate portion.

In the infrared sensor, it is preferable that the cover member is formed of a conductive material.

In the infrared sensor, it is preferable that the cover member is bonded to the package main body by a conductive material.

In the infrared sensor, it is preferable that the package main body includes: a base formed of an insulating material; and an electromagnetic shielding layer formed of a metal material.

According to the present invention, it is possible to suppress variation in the S/N ratio in a plane of the infrared sensor chip resulting from heating of the IC chip.

BRIEF DESCRIPTION OF DRAWINGS

FIG. 1 relates to an infrared sensor of a first embodiment, in which FIG. 1A is a partially cutaway schematic perspective view, FIG. 1B is a schematic perspective view showing a state where a package cover is removed, FIG. 1C is a schematic side view showing a state where the package cover is removed, FIG. 1D is a schematic cross-sectional view, and FIG. 1E is a schematic cross-sectional view showing a main part of an infrared sensor chip;

FIG. 5 shows a main part of the pixel portion of the infrared sensor chip in the first embodiment, in which FIG. 5A is a planar layout view, and FIG. 5B is a schematic cross-sectional view corresponding to a D-D' cross-section of FIG. 5A;

FIG. 8 shows a main part of the pixel portion of the infrared sensor chip in the first embodiment, in which FIG. 8A is a planar layout view, and FIG. 8B is a schematic cross-sectional view corresponding to a D-D' cross-section of FIG. 8A;

FIG. 9 shows a main part including a cold junction of the infrared sensor chip in the first embodiment, in which FIG. 9A is a planar layout view and FIG. 9B is a schematic cross-sectional view;

FIG. 10 shows a main part including a hot junction of the infrared sensor chip in the first embodiment, in which FIG. 10A is a planar layout view and FIG. 10B is a schematic cross-sectional view;

FIG. 11 is a schematic cross-sectional view showing a main part of the pixel portion of the infrared sensor chip in the first embodiment;

FIGS. 13A and 13B are views for explaining a main part of the infrared sensor chip in the first embodiment;

FIGS. 15A and 15B are cross-sectional views for explaining main steps of a method of producing the infrared sensor in the first embodiment;

FIGS. 16A and 16B are cross-sectional views for explaining main steps of the method of producing the infrared sensor in the first embodiment;

FIG. 19 relates to an infrared sensor of a second embodiment, in which FIG. 19A is a partially cutaway schematic perspective view, FIG. 19B is a schematic perspective view showing a state where a package cover is removed, FIG. 19C is a schematic side view showing a state where the package cover is removed, FIG. 19D is a schematic cross-sectional view, and FIG. 19E is a schematic cross-sectional view showing a main part of an infrared sensor chip;

FIG. 20 relates to an infrared sensor of a third embodiment, in which FIG. 20A is a partially cutaway schematic perspective view, FIG. 20B is a schematic perspective view showing a state where a package cover is removed, FIG. 20C is a schematic side view showing a state where the package cover is removed, FIG. 20D is a schematic cross-sectional view, and FIG. 20E is a schematic cross-sectional view showing a main part of an infrared sensor chip; and FIG. 21 relates to an infrared sensor of a fourth embodiment, in which FIG. 21A is a partially cutaway schematic perspective view, FIG. 21B is a schematic perspective view showing a state where a package cover is removed, FIG. 21C is a schematic side view showing a state where the package cover is removed, FIG. 21D is a schematic cross-sectional view, and FIG. 21E is a schematic cross-sectional view showing a main part of an infrared sensor chip.

BEST MODE FOR CARRYING OUT THE INVENTION

First Embodiment

Figure 1:
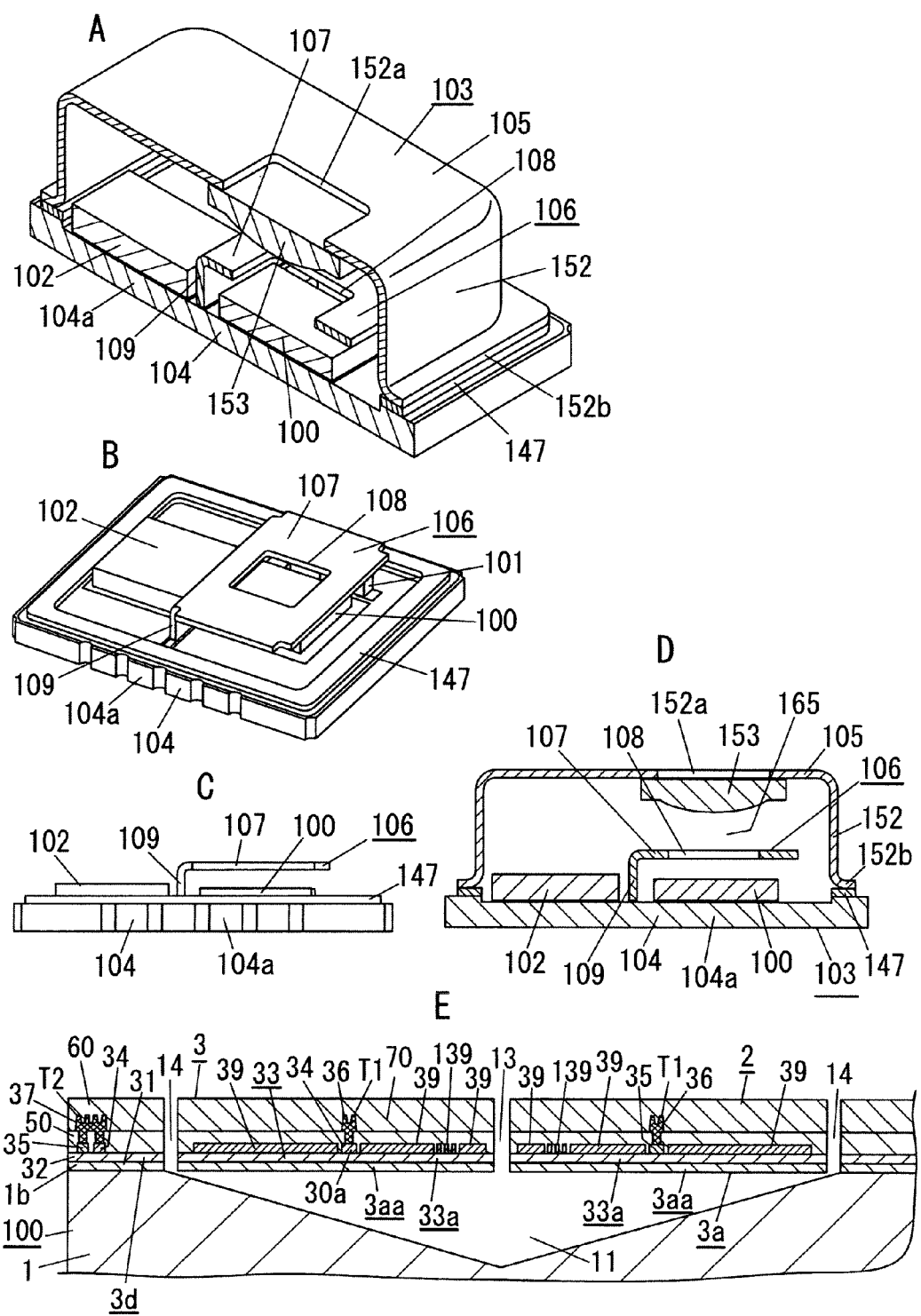

Hereinafter, an infrared sensor of this embodiment will be described with reference to FIGS. 1 to 14.

An infrared sensor of this embodiment includes an infrared sensor chip 100, an IC chip 102 that processes an output signal of the infrared sensor chip 100, and a package 103 in which the infrared sensor chip 100 and the IC chip 102 are accommodated. In the infrared sensor, a thermistor 101 for measuring the absolute temperature is also accommodated in the package 103.

As shown in FIG. 1E, the infrared sensor chip 100 includes thermal infrared detectors 3 including a thermopile 30a. The thermal infrared detector 3 is formed on one surface side (front surface side) of a semiconductor substrate 1 formed of a silicon substrate.

The package 103 includes: a package main body 104 on which the infrared sensor chip 100, the IC chip 102, and the thermistor 101 are mounted; and a package cover 105 that is hermetically bonded to the package main body 104 in such a manner that the infrared sensor chip 100, the IC chip 102, and the thermistor 101 are surrounded by the package main body 104 and the package cover 105.

In the package main body 104, the IC chip 102 and the infrared sensor chip 100 are mounted to be arranged horizontally. Moreover, in the package main body 104, the infrared sensor chip 100 and the thermistor 101 are mounted to be arranged horizontally in a direction orthogonal to the arrangement direction of the IC chip 102 and the infrared sensor chip 100. The package cover 105 has a function of transmitting infrared rays to be detected by the infrared sensor chip 100. The package cover 105 has conductive properties.

The package cover 105 includes a metal cap 152 that is attached to the one surface side (front surface side) of the package main body 104 and a lens 153. The metal cap 152 is formed with an opening window 152a at a portion corresponding to the infrared sensor chip 100. The lens 153 occludes the opening window 152a. Here, the lens 153 has a function of transmitting infrared rays and a function of focusing infrared rays on the infrared sensor chip 100.

Moreover, the infrared sensor includes a cover member 106 that is provided within the package 103 so as to equalize, among the pixel portions 2, the amounts of temperature change of hot junctions T1 and cold junctions T2 resulting from the heating of the IC chip 102. Here, the cover member 106 includes a window hole 108 through which infrared rays pass into the infrared sensor chip 100. In each of the pixel portions 2, a temperature difference ΔT may occur between the hot junction T1 and the cold junction T2 due to the heating of the IC chip 102. In this embodiment, by providing the cover member 106, it is possible to decrease variation in the temperature difference ΔT (variation in the temperature difference ΔT between the hot junction T1 and the cold junction T2 resulting from the heating of the IC chip 102) among the respective pixel portions 2.

The configuration of the cover member 106 that equalizes the amounts of temperature change of the hot junctions T1 and the cold junctions T2 among the pixel portions 2 resulting from the heating of the IC chip 102 is an optional member. As will be described later, the cover member 106 includes a front plate portion 107 which is located on a front side of the infrared sensor chip 100 and in which the window hole 108 is formed, and a side plate portion 109 that is extended toward a rear side from the front plate portion and is bonded to the package main body 104. The cover member 106 is disposed in proximity to both the infrared sensor chip 100 and the IC chip 102.

Hereinafter, the respective constituent components will be described in further detail.

Figure 2:
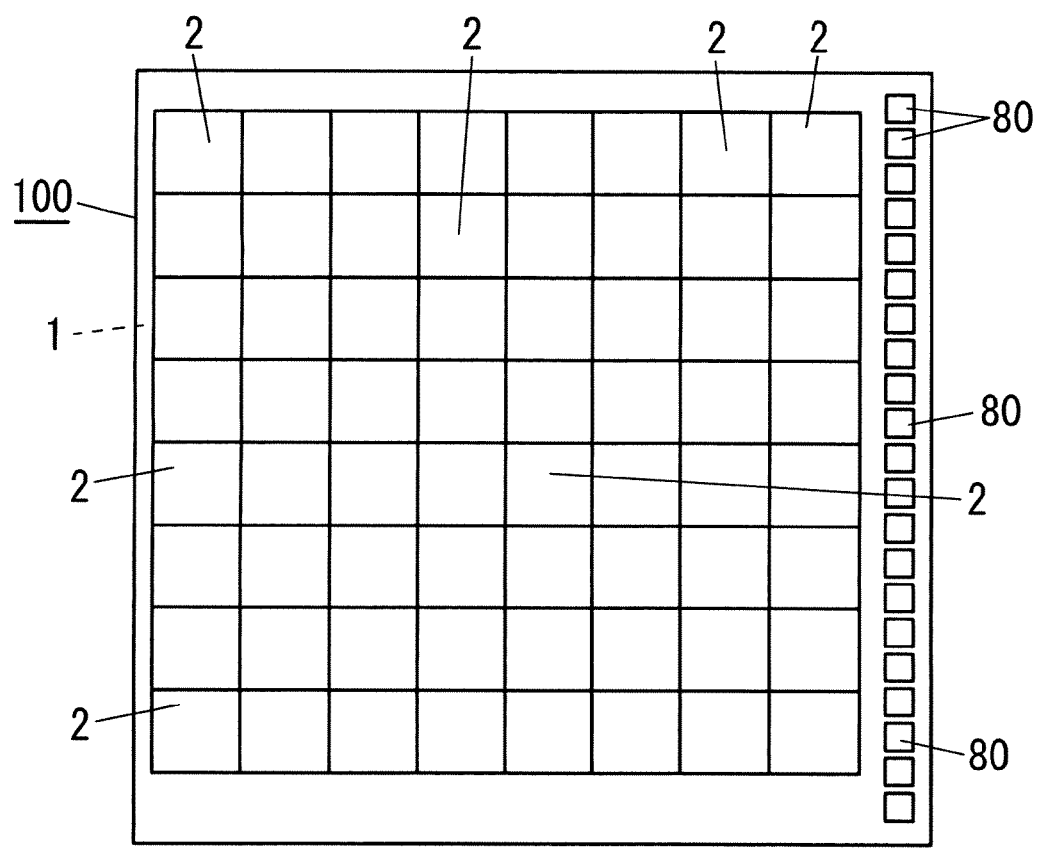
FIG. 2 is a planar layout view of the infrared sensor chip in the first embodiment.
Figure 14:
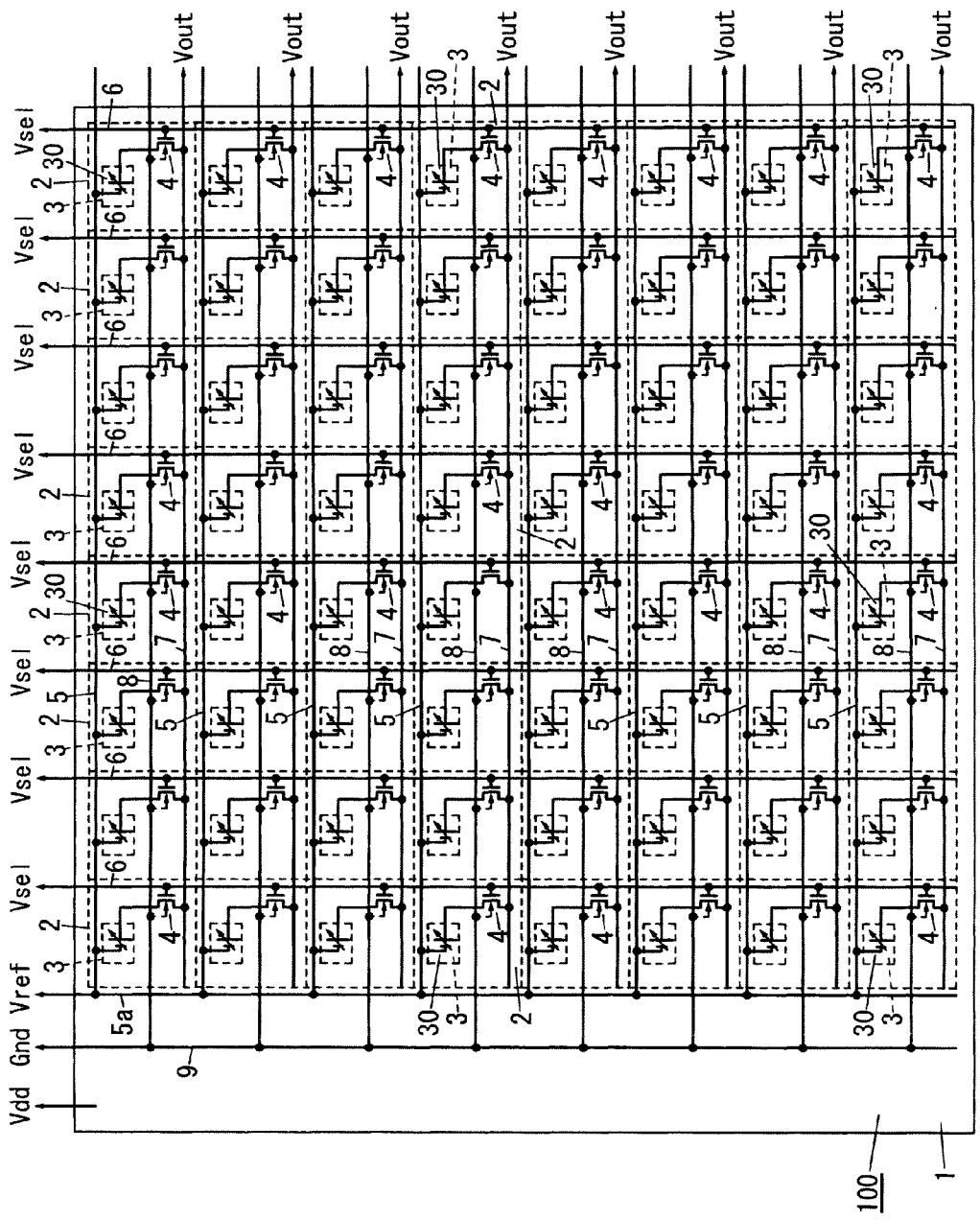
FIG. 14 is an equivalent circuit diagram of the infrared sensor chip in the first embodiment.
Figure 17:
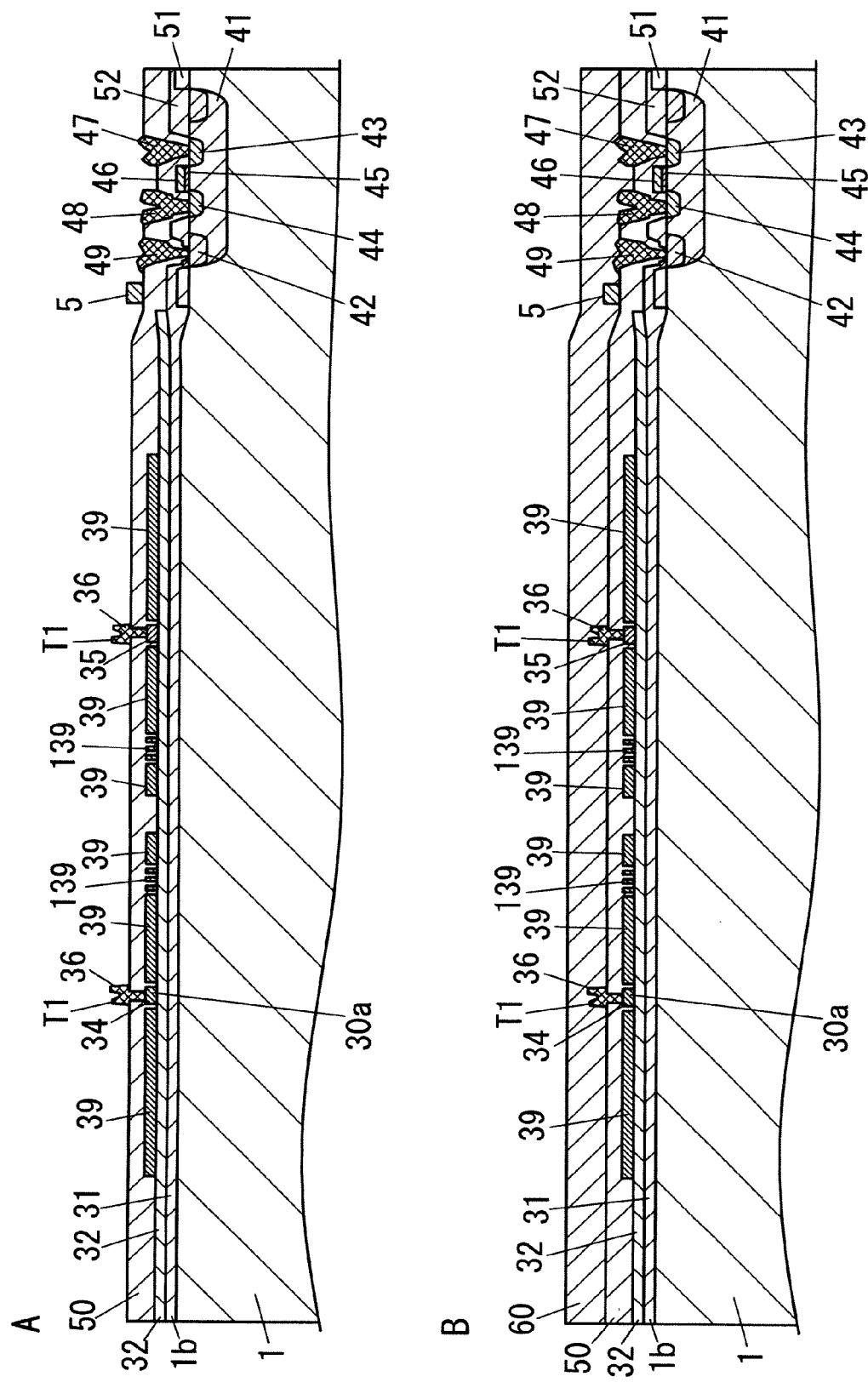
FIGS. 17A and 17B are cross-sectional views for explaining main steps of the method of producing the infrared sensor in the first embodiment.
Figure 18:
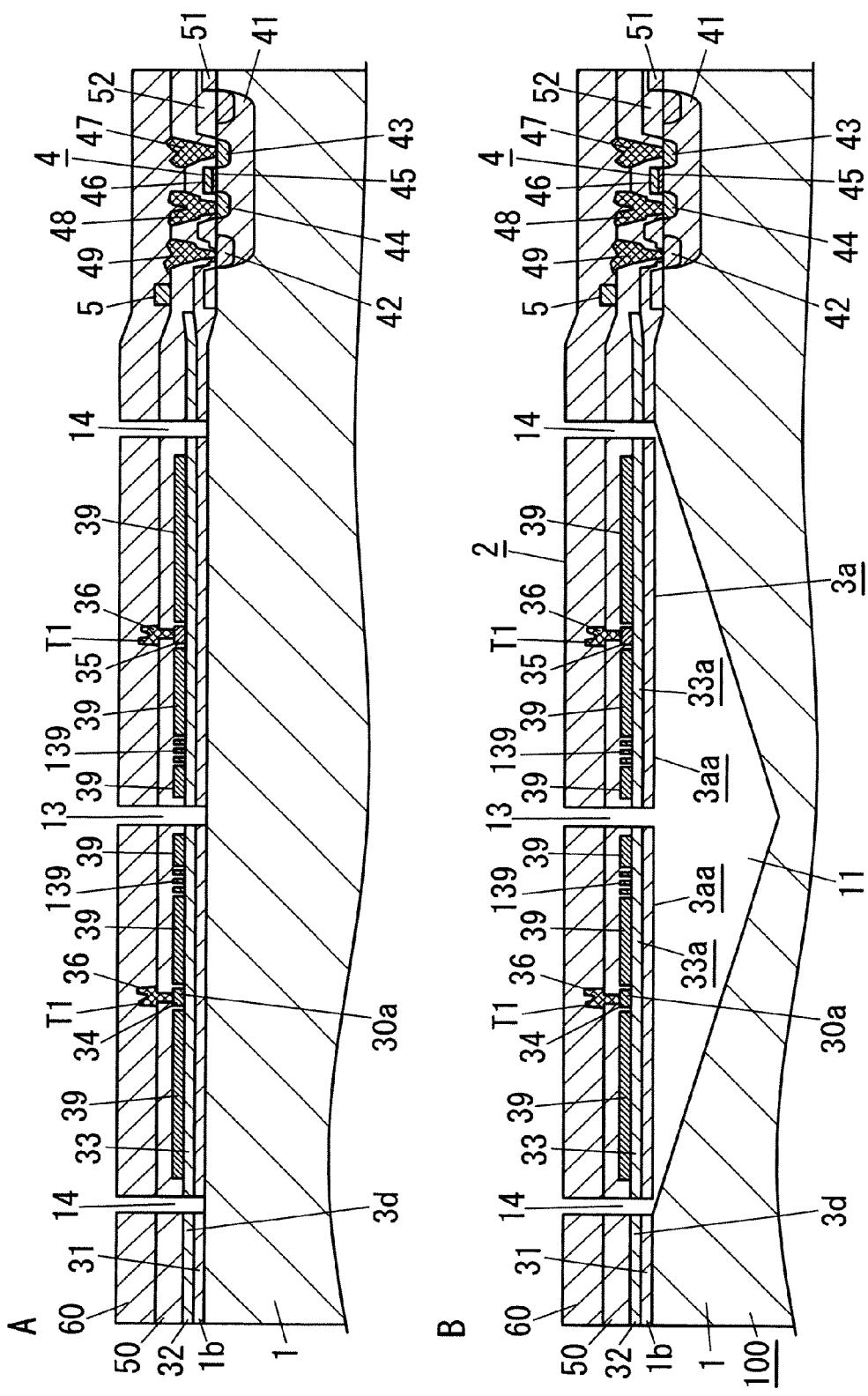
FIGS. 18A and 18B are cross-sectional views for explaining main steps of the method of producing the infrared sensor in the first embodiment.

In the infrared sensor chip 100, a plurality of pixel portions 2 each having the thermal infrared detector 3 and a MOS transistor 4 which is a pixel selection switching element is arranged on the one surface side of the semiconductor substrate 1 in an array (in this example, in a 2-dimensional array) (see FIG. 2). In this embodiment, although m×n (8×8 in the example shown in FIG. 2) pixel portions 2 are formed on the one surface side of one semiconductor substrate 1, the number and the arrangement of the pixel portions 2 are not particularly limited. Moreover, in this embodiment, the temperature-sensitive portion 30 of the thermal infrared detector 3 is formed by connecting a plurality of (six in this example) thermopiles 30a (see FIG. 3) in series. In FIG. 14, an equivalent circuit of the temperature-sensitive portion 30 of the thermal infrared detector 3 is depicted as a voltage source that corresponds to thermo-electromotive force of the temperature-sensitive portion 30.

Figure 3:
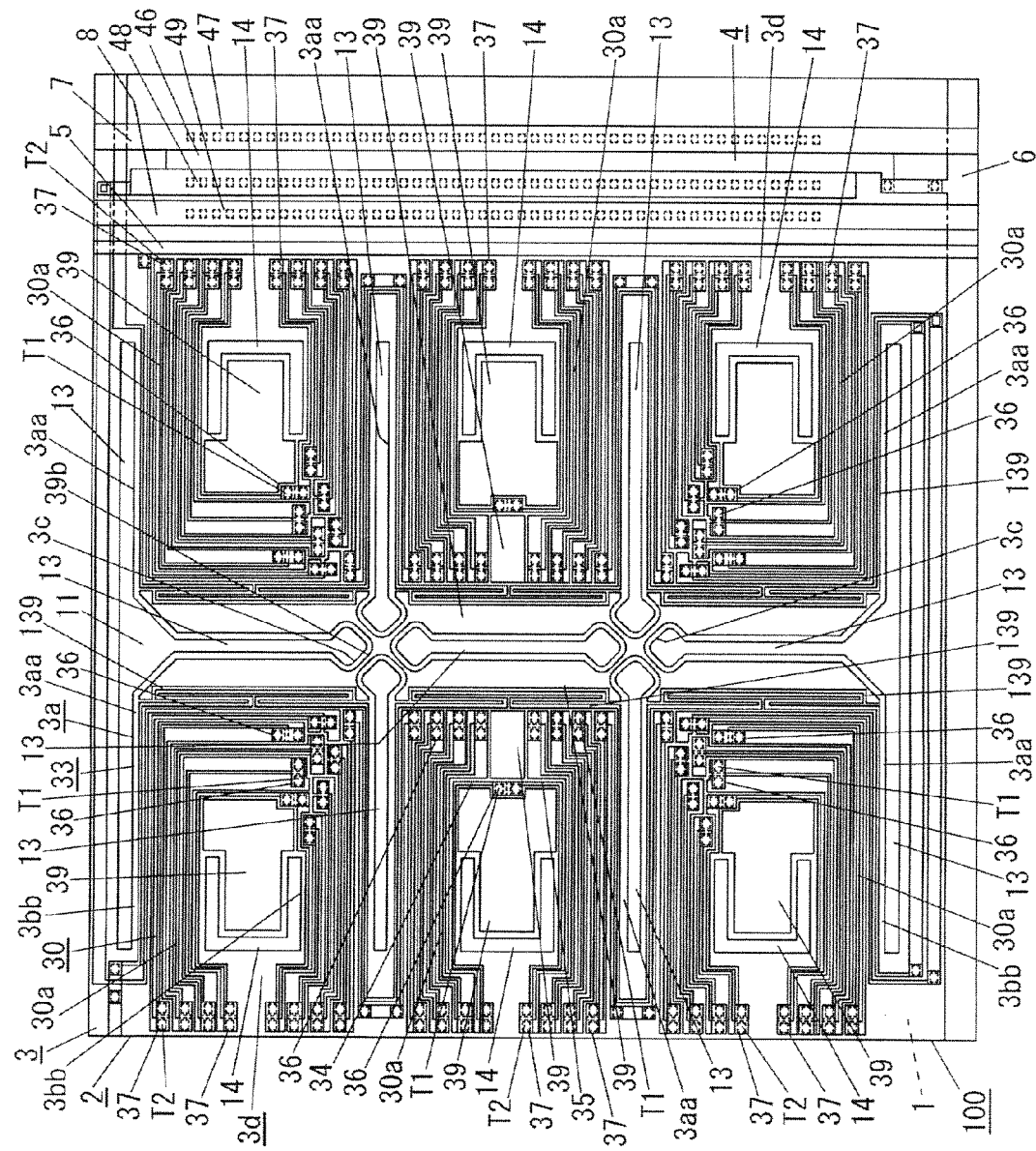
FIG. 3 is a planar layout view of a pixel portion of the infrared sensor chip in the first embodiment.
Figure 4:
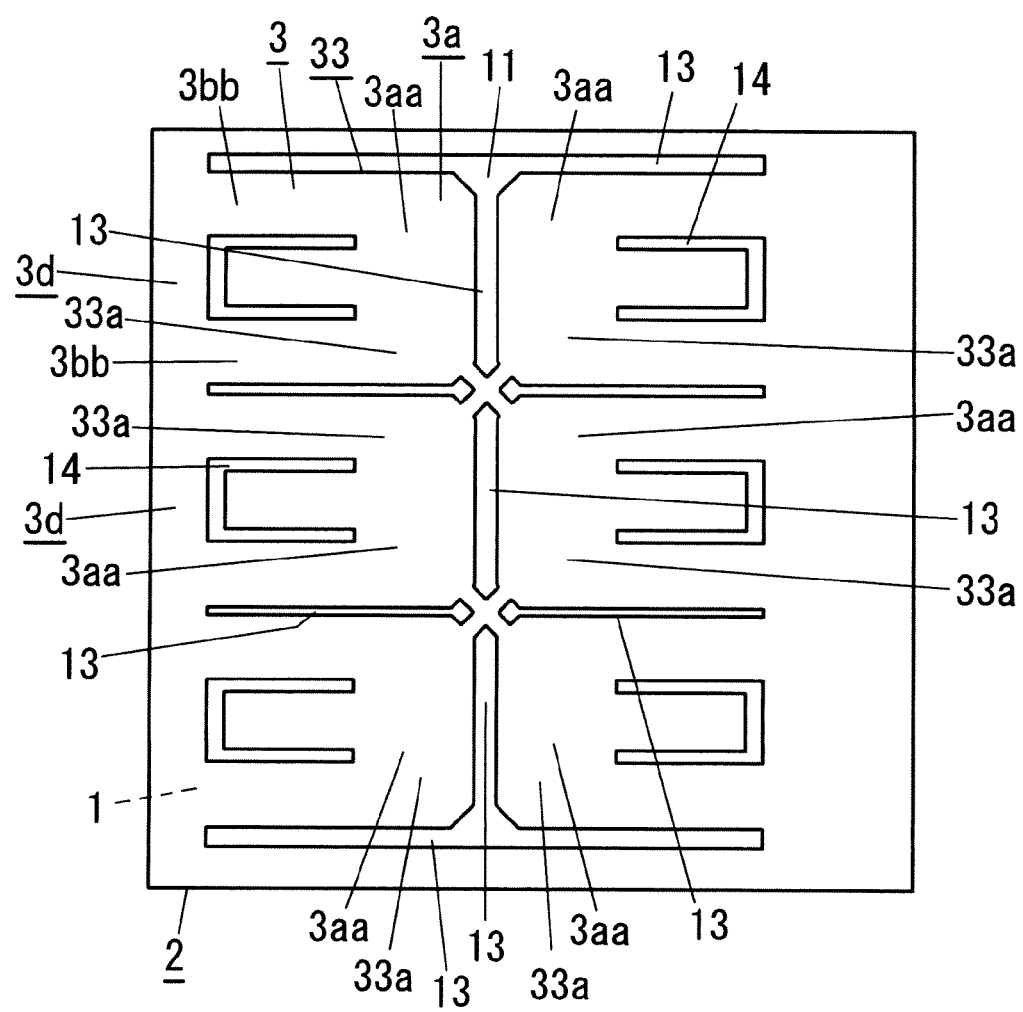
FIG. 4 is a planar layout view of the pixel portion of the infrared sensor chip in the first embodiment.
Figure 5:
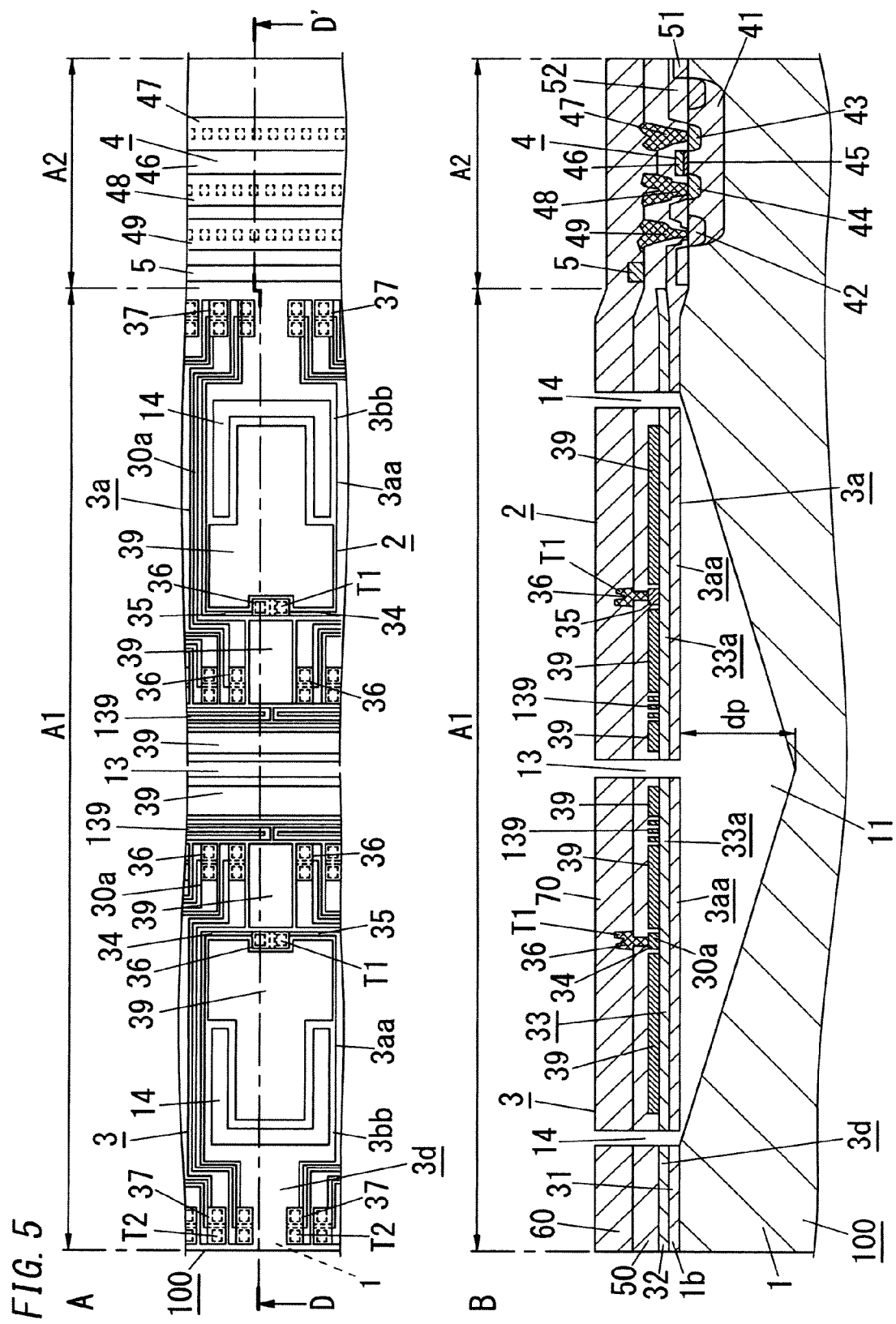

Moreover, as shown in FIGS. 3, 5, and 14, the infrared sensor chip 100 includes: a plurality of vertical read lines 7 and a plurality of horizontal signal lines 6. For each of vertical read lines 7, a set of one ends of the temperature-sensitive portions 30 of a plurality of thermal infrared detectors 3 on one column are connected in common for each column via the MOS transistor 4. For each of horizontal signal lines 6, gate electrodes 46 of the MOS transistors 4 corresponding to the temperature-sensitive portions 30 of the thermal infrared detectors 3 on one row are connected in common for each row. Moreover, the infrared sensor chip 100 includes a plurality of ground lines 8 and a common ground line 9. For each ground lines 8, $p^+$-type well regions 41 of the MOS transistors 4 on one column are connected in common for each column. The respective ground lines 8 are connected to the common ground line 9 in common. Further, the infrared sensor chip 100 includes a plurality of reference bias lines 5. For each of the reference bias lines 5, a set of the other ends of the temperature-sensitive portions 30 of the plurality of thermal infrared detectors 3 on one column are connected in common for each column. Therefore, the infrared sensor chip 100 is configured to read the output of the temperature-sensitive portions 30 of all thermal infrared detectors 3 in a time-sequential manner. In short, in the infrared sensor chip 100, a plurality of pixel portions 2 is formed on the one surface side of the semiconductor substrate 1, each pixel portions 2 including the thermal infrared detector 3 and the MOS transistor 4 that is arranged in parallel to the thermal infrared detector 3 so as to read the output of the thermal infrared detector 3.

Here, the MOS transistor 4 has the gate electrode 46 connected to the horizontal signal line 6, a source electrode 48 connected to the reference bias line 5 via the temperature-sensitive portion 30, and a drain electrode 47 connected to the vertical read line 7. Here, the respective horizontal signal lines 6 are electrically connected to separate pixel selection pads Vsel, the respective reference bias lines 5 are connected in common to a common reference bias line 5a, and the respective vertical read lines 7 are electrically connected to separate output pads Vout. The common ground line 9 is electrically connected to a ground pad Gnd, the common reference bias line 5a is electrically connected to a reference bias pad Vref, and the semiconductor substrate 1 is electrically connected to a substrate pad Vdd.

Therefore, by controlling the potential of the respective pixel selection pads Vsel so that the MOS transistors 4 are sequentially turned on, it is possible to sequentially read the output voltages of the respective pixel portions 2. For example, when the potential of the reference bias pad Vref is set to 1.65V, the potential of the ground pad Gnd is set to 0V, the potential of the substrate pad Vdd is set to 5V, and the potential of a specific pixel selection pad Vsel is set to 5V, the corresponding MOS transistor 4 is turned on, and the output voltage (1.65V+ the output voltage of temperature-sensitive portion 30) of the pixel portion 2 is read from the corresponding output pad Vout. When the potential of the pixel selection pad Vsel is set to 0V, the MOS transistor 4 is turned off, and the output voltage of the pixel portion 2 is not read from the output pad Vout. In FIG. 2, the pixel selection pad Vsel, the reference bias pad Vref, the ground pad Gnd, the output pad Vout, and the like shown in FIG. 14 are not distinguished, and all pads are depicted as pads 80.

Hereinafter, the structures of the thermal infrared detector 3 and the MOS transistor 4 will be described. In this embodiment, an n-type single-crystalline silicon substrate in which the abovementioned "one surface" is formed by the (100) plane is used as the semiconductor substrate 1.

The thermal infrared detector 3 of each of the pixel portions 2 is formed in a formation region A1 (see FIG. 5) for the thermal infrared detector 3 on the one surface side of the semiconductor substrate 1. Moreover, the MOS transistor 4 of each of the pixel portions 2 is formed in a formation region A2 (see FIG. 5) for the MOS transistor 4 on the one surface side of the semiconductor substrate 1.

The infrared sensor chip 100 includes cavity portions 11 each of which is formed on the one surface side of the semiconductor substrate 1 immediately below a part of the thermal infrared detectors 3. The thermal infrared detector 3 includes: a supporting portion 3d that is formed in a circumferential portion of the cavity portion 11 on the one surface side of the semiconductor substrate 1; and a first thin-film structural portion 3a that is disposed on the one surface side of the semiconductor substrate 1 so as to cover the cavity portion 11 in a plan view. The first thin-film structural portion 3a includes an infrared absorbing portion 33 that absorbs infrared rays. Here, the first thin-film structural portion 3a includes: a plurality of second thin-film structural portions 3aa that is arranged along a circumferential direction (in FIG. 3, a horizontal direction in relation to the surface of the figure) of the cavity portion 11 and is supported by the supporting portion 3d; and a connecting piece 3c that connects the adjacent second thin-film structural portions 3aa. In the thermal infrared detector 3 of the example shown in FIG. 3, a plurality of linear slits 13 is provided so that the first thin-film structural portion 3a is divided into six second thin-film structural portions 3aa. In the following description, respective divided portions of the infrared absorbing portion 33 corresponding to the second thin-film structural portions 3aa will be referred to as second infrared absorbing portions 33a (also, the infrared absorbing portion 33 if referred to as a first infrared absorbing portion 33).

The thermal infrared detector 3 includes the thermopiles 30a. The thermopile 30a is provided to each of the second thin-film structural portions 3aa. Here, in the thermopile 30a, the hot junction T1 is provided in the second thin-film structural portion 3aa and the cold junction T2 is provided in the supporting portion 3d. In short, the hot junction T1 is formed in a first region of the thermal infrared detector 3 that overlaps the cavity portion 11, and the cold junction T2 is formed in a second region of the thermal infrared detector 3 that does not overlap the cavity portion 11.

In short, the infrared sensor chip 100 includes a plurality of pixel portions 2. The pixel portion 2 includes the thermal infrared detector 3 that is formed on the one surface side (front surface side) of the semiconductor substrate 1. The thermal infrared detector 3 includes the temperature-sensitive portion 30. The cavity portion 11 is formed in a portion of the one surface side of the semiconductor substrate 1 corresponding to a part of the thermal infrared detector 3. Moreover, the hot junction T1 of the temperature-sensitive portion 30 is formed in the first region of the thermal infrared detector 3 that overlaps the cavity portion 11, and the cold junction T2 of the temperature-sensitive portion 30 is formed in the second region of the thermal infrared detector 3 that does not overlap the cavity portion 11.

Moreover, in the temperature-sensitive portion 30 of the thermal infrared detector 3, all thermopiles 30a are electrically connected in such a connection relationship that a change in output according to a change in temperature becomes larger as compared to a case of taking an output separately from each of the thermopiles 30a. In the example of FIG. 3, the temperature-sensitive portion 30 includes six thermopiles 30a that are connected in series. However, the connection relationship is not limited to such a connection relationship that all of a plurality of thermopiles 30a is connected in series. For example, when series circuits each made up of three thermopiles 30a are connected in parallel, it is possible to increase sensitivity as compared to a case where six thermopiles 30a are connected in parallel and a case where the output is separately taken from each of the thermopiles 30a. Moreover, since this configuration is possible to decrease the electric resistance of the temperature-sensitive portion 30 and to reduce thermal noise as compared to a case where all of six thermopiles 30a are connected in series, the S/N ratio is improved.

Here, in the thermal infrared detector 3, two bridge portions 3bb having a strip shape in a plan view that connect the supporting portion 3d and the second infrared absorbing portion 33a are formed for each of the second thin-film structural portions 3aa. Here, the two bridge portions 3bb are formed to be spaced from each other in the circumferential direction of the cavity portion 11. That is, each of the second thin-film structural portions 3aa includes the second infrared absorbing portion 33a and two bridge portions 3bb. A slit 14 having a C-shape in a plan view that communicates with the cavity portion 11 is formed so as to spatially divide the two bridge portions 3bb and the second infrared absorbing portion 33a. The supporting portion 3d which is a portion of the thermal infrared detector 3 that surrounds the first thin-film structural portion 3a in a plan view is formed in a rectangular frame shape. Due to the respective slits (13, 14), a portion of the bridge portion 3bb other than the connecting portions between the second infrared absorbing portion 33a and the supporting portion 3d is spatially divided from the second infrared absorbing portion 33a and the supporting portion 3d. Here, in the second thin-film structural portion 3aa, a dimension in an extension direction from the supporting portion 3d is set to 93 µm, a dimension in a width direction orthogonal to the extension direction is set to 75 µm, and a width dimension of each of the bridge portions 3bb is set to 23 µm. The width of each of the slits (13, 14) is set to 5 µm. However, these values are exemplary and are not particularly limited thereto.

The first thin-film structural portion 3a is formed by patterning a stacked structural portion that includes: a silicon dioxide film 1b formed on the one surface side of the semiconductor substrate 1; a silicon nitride film 32 formed on the silicon dioxide film 1b; the temperature-sensitive portion 30 formed on the silicon nitride film 32; an interlayer insulating film 50 formed on the front surface side of the silicon nitride film 32 so as to cover the temperature-sensitive portion 30; and a passivation film 60 formed on the interlayer insulating film 50. The interlayer insulating film 50 is formed of a BPSG film, and the passivation film 60 is formed of a stacked film that includes a PSG film and a NSG film formed on the PSG film. However, these films are not limited to this and may be formed of a silicon nitride film, for example.

In the thermal infrared detector 3 described above, a portion of the first thin-film structural portion 3a other than the bridge portions 3bb forms the first infrared absorbing portion 33. Moreover, the supporting portion 3d is formed by the silicon dioxide film 1b, the silicon nitride film 32, the interlayer insulating film 50, and the passivation film 60.

In the infrared sensor chip 100, a stacked film of the interlayer insulating film 50 and the passivation film 60 is formed on the one surface side of the semiconductor substrate 1 so as to extend over the formation region A1 for the thermal infrared detector 3 and the formation region A2 for the MOS transistor 4, and a portion of the stacked film formed in the formation region A1 of the thermal infrared detector 3 also serves as an infrared absorbing film 70 (see FIG. 5B). Here, when a refractive index of the infrared absorbing film 70 is $n_2$ and the central wavelength of infrared rays to be detected is $\lambda$, a thickness t2 of the infrared absorbing film 70 is set to $\lambda/4n_2$. Therefore, it is possible to increase absorption efficiency of infrared rays having a detection target wavelength (for example, 8 μm to 12 μm) and to obtain high sensitivity. For example, when $n_2$=1.4 and $\lambda$=10 μm, the thickness may be set to be t2≈1.8 μm. In this embodiment, the thickness of the interlayer insulating film 50 is set to 0.8 μm, and the thickness of the passivation film 60 is set to 1 μm (the thickness of the PSG film is 0.5 μm and the thickness of the NSG film is 0.5 μm).

In each pixel portions 2, shape of the inner circumferential of the cavity portion 11 is rectangular, and the connecting piece 3c is formed in an X-shape in a plan view so as to connect: the second thin-film structural portions (3aa, 3aa) that are adjacent in an oblique direction crossing the extension direction of the second thin-film structural portion 3aa (extension direction from the supporting portion 3d); the second thin-film structural portions (3aa, 3aa) that are adjacent in the extension direction of the second thin-film structural portion 3aa; and the second thin-film structural portions (3aa, 3aa) that are adjacent in a direction orthogonal to the extension direction of the second thin-film structural portion 3aa.

The thermopile 30a includes a plurality of (nine for each thermopile 30a in the example shown in FIG. 3) thermocouples. The thermocouple includes: an n-type polysilicon layer 34 and a p-type polysilicon layer 35 that are formed on the silicon nitride film 32 so as to extend over the second thin-film structural portion 3aa and the supporting portion 3d; and a connecting portion (first connecting portion) 36 that is formed of a metal material (for example, Al—Si or the like) and connects between one end portions of the n-type polysilicon layer 34 and the p-type polysilicon layer 35 on an infrared ray entrance surface side of the second infrared absorbing portion 33a. That is, in this embodiment, a first end portion of the n-type polysilicon layer 34 and a first end portion of the p-type polysilicon layer 35 are electrically connected by the connecting portion 36. Moreover, in the thermopile 30a, the other end portions of the n-type polysilicon layers 34 (second end portions of the n-type polysilicon layers 34) and the other end portions of the p-type polysilicon layers 35 (second end portions of the p-type polysilicon layers 35) of thermocouples that are adjacent on the one surface side of the semiconductor substrate 1 are bonded and electrically connected by a connecting portion (second connecting portion) 37 that is formed of a metal material (for example, Al—Si or the like), respectively. Here, in the thermopile 30a, the one end portion of the n-type polysilicon layer 34, the one end portion of the p-type polysilicon layer 35, and the connecting portion 36 form the hot junction T1. Moreover, the cold junction T2 is formed by the other end portion of the n-type polysilicon layer 34, the other end portion of the p-type polysilicon layer 35, and the connecting portion 37. Therefore, the respective hot junctions T1 of the thermopiles 30a are formed in a region of the thermal infrared detector 3 that overlaps the cavity portion 11, and the respective cold junctions T2 are formed in a region of the thermal infrared detector 3 that does not overlap the cavity portion 11. In the infrared sensor chip 100 of this embodiment, infrared rays can be absorbed in portions of the n-type polysilicon layers 34 and the p-type polysilicon layers 35 of the thermopile 30a, which are formed in the bridge portions 3bb and portions of the polysilicon layers (34, 35), which are formed on the silicon nitride film 32 on the one surface side of the semiconductor substrate 1.

In short, the temperature-sensitive portion 30 includes at least one thermocouple that includes the n-type polysilicon layer 34 and the p-type polysilicon layer 35. The hot junction T1 of this thermocouple is formed in a first region of the thermal infrared detector 3 that overlaps the cavity portion 11, and the cold junction T2 of the thermocouple is formed in a second region of the thermal infrared detector 3 that does not overlap the cavity portion 11.

Figure 6:
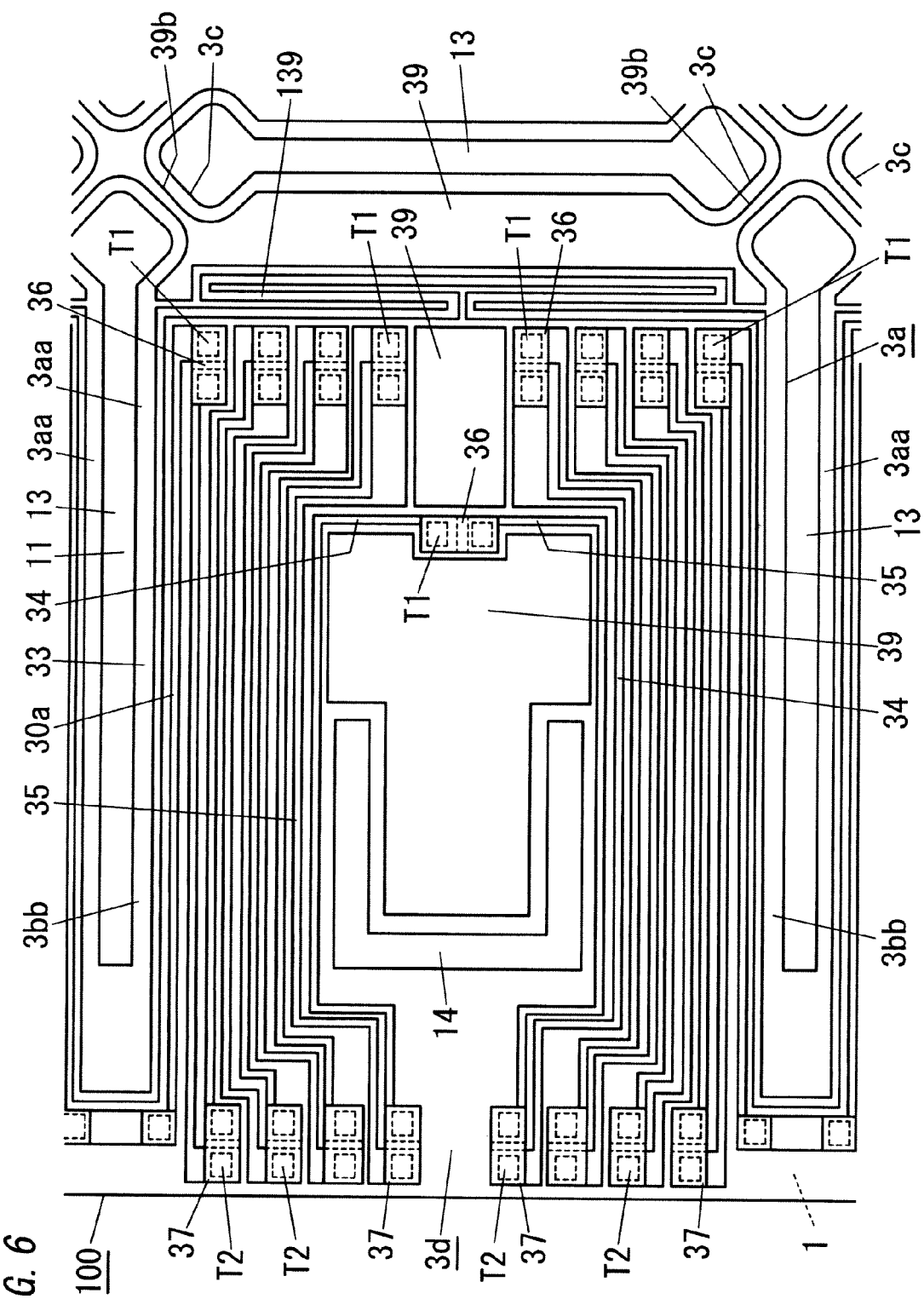
FIG. 6 is a planar layout view of a main part of the pixel portion of the infrared sensor chip in the first embodiment.
Figure 7:
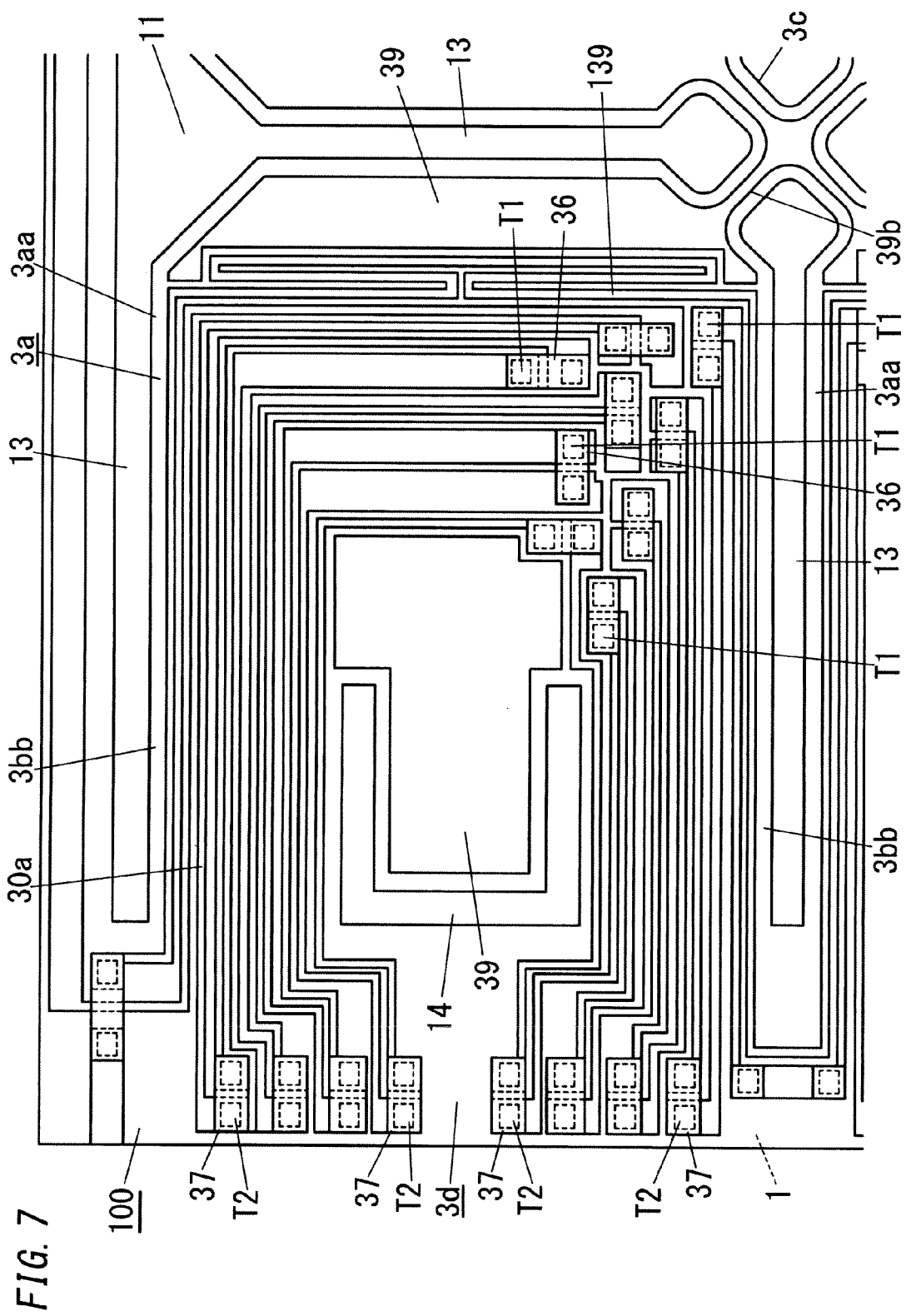
FIG. 7 is a planar layout view of a main part of the pixel portion of the infrared sensor chip in the first embodiment.

In the infrared sensor chip 100, since the shape of the cavity portion 11 is square pyramidal, and a central portion in a plan view has a depth dimension larger than that of the circumferential portion. In this embodiment therefore, a planar layout of the thermopile 30a in each pixel portion 2 is designed such that the hot junctions T1 gather in the central portion of the first thin-film structural portion 3a. That is, in the two second thin-film structural portions 3aa at the center in the vertical direction of FIG. 3, as shown in FIGS. 3 and 6, the hot junctions T1 are disposed to be arranged in a line along the arrangement direction (the vertical direction of FIG. 3) of three second thin-film structural portions 3aa. In contrast, in the two second thin-film structural portions 3aa on the upper side in the vertical direction, as shown in FIGS. 3 and 7, the hot junctions T1 are disposed to be concentrated on a side (the lower side of FIG. 3) closer to the second thin-film structural portion 3aa at the center in the arrangement direction of the three second thin-film structural portions 3aa. Further, in the two second thin-film structural portions 3aa on the lower side in the vertical direction, the hot junctions T1 are disposed to be concentrated on a side (the upper side of FIG. 3) closer to the second thin-film structural portion 3aa at the center in the arrangement direction of the three second thin-film structural portions 3aa. Therefore, in the infrared sensor chip 100 of this embodiment, it is possible to increase a change in temperature of the hot junction T1 as compared to a case where the arrangement of the plurality of hot junctions T1 of the second thin-film structural portions 3aa on the upper and lower sides in the vertical direction of FIG. 3 is the same as the arrangement of the plurality of hot junctions T1 of the second thin-film structural portion 3aa at the center. Thus, it is possible to improve sensitivity. In this embodiment, when the depth of a deepest portion of the cavity portion 11 is a predetermined depth "dp" (see FIG. 5B), the predetermined depth "dp" is set to 200 μm. However, this value is exemplary and is not particularly limited thereto.

Moreover, the second thin-film structural portion 3aa includes an infrared absorbing layer 39 (see FIGS. 1, 3, 5, and 11) formed of a n-type polysilicon layer, in a region where the thermopile 30a is not formed on an infrared ray entrance surface side of the silicon nitride film 32, so as to suppress warpage of the second thin-film structural portion 3aa and absorb infrared rays. Moreover, a reinforcing layer 39b (see FIG. 8) that is formed of a n-type polysilicon layer so as to reinforce the connecting piece 3c is formed in the connecting piece 3c that connects the adjacent second thin-film structural portions 3aa. Here, the reinforcing layer 39b is formed to be continuous to and integrated with the infrared absorbing layer 39. Therefore, in the infrared sensor chip 100, since the connecting piece 3c is reinforced by the reinforcing layer 39b, it is possible to prevent damage resulting from stress that occurs due to a change in the outside temperature and an impact during usage. Further, it is possible to reduce damage during production and to improve production yield. In this embodiment, a length dimension L1 of the connecting piece 3c is set to 24 μm, a width dimension L2 of the connecting piece 3c is set to 5 μm, and a width dimension L3 of the reinforcing layer 39b is set to 1 μm (see FIG. 8), but these values are exemplary and are not particularly limited thereto. However, when a silicon substrate is used as the semiconductor substrate 1 and the reinforcing layer 39b is formed of a n-type polysilicon layer as in this embodiment, in order to prevent the reinforcing layer 39b from being etched when forming the cavity portion 11, it is necessary to set the width dimension L3 of the reinforcing layer 39b to be smaller than the width dimension L2 of the connecting piece 3c and both side edges of the reinforcing layer 39b need to be positioned on the inner side than both side edges of the connecting piece 3c in a plan view.

Figure 8:
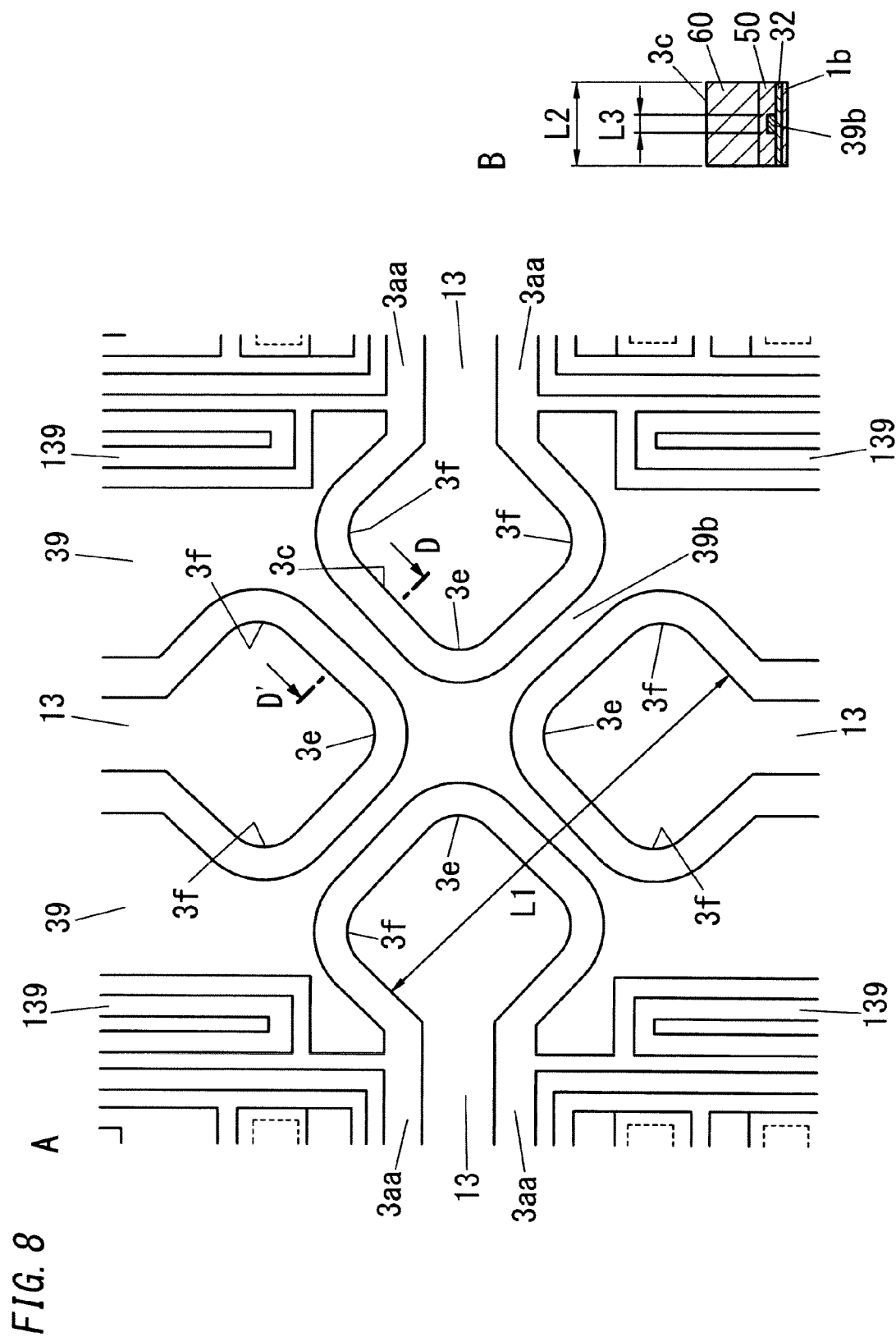

Moreover, as shown in FIGS. 8 and 13B, chamfered portions 3f are formed in positions between side edges of the connecting piece 3c and side edges of the second thin-film structural portion 3aa, and a chamfered portion 3e is formed in an approximately intersecting position between side edges of the X-shaped connecting piece 3c. Therefore, in the infrared sensor chip 100, it is possible to relieve concentration of stress in the connecting portion between the connecting piece 3c and the second thin-film structural portion 3aa and therefore possible to reduce residual stress occurring during production, as compared to a case (see FIG. 13A) where no chamfered portion is formed. Further, it is possible to reduce damage during production and to improve production yield. Furthermore, it is possible to prevent damage resulting from stress that occurs due to a change in the outside temperature and an impact during usage. In the example shown in FIG. 8, the chamfered portions (3f, 3e) are R-chamfered portions of which the radius of curvature R is 3 μm, but the chamfered portion is not limited to an R-chamfered portion and may be a C-chamfered portion, for example.

In each of the thermal infrared detectors 3 in the infrared sensor chip 100, a wire for fault diagnosis (hereinafter referred to as fault diagnosis wire or self-diagnosis wire) 139 formed of a n-type polysilicon layer are provided so as to extend along a line of the supporting portion 3d, one bridge portion 3bb, the second infrared absorbing portion 33a, the other bridge portion 3bb, and the supporting portion 3d. In the infrared sensor chip 100, all fault diagnosis wires 139 are connected in series. Therefore, by allowing current to flow into a series circuit of m×n fault diagnosis wires 139, it is possible to detect the presence of damage such as bending of the bridge portion 3bb.

In short, the infrared sensor chip 100 can detect bending of the bridge portion 3bb, breaking of the fault diagnosis wires 139, and the like based on the presence of current flowing into the series circuit of the m×n fault diagnosis wires 139 during inspection in the course of production and during usage. Moreover, in the infrared sensor chip 100, by allowing current to flow into the series circuit of the m×n fault diagnosis wires 139 to detect the output of the respective temperature-sensitive portions 30 during the inspection and usage, it is possible to detect the presence of disconnection of the temperature-sensitive portion 30, variation in sensitivity (variation in the output of the temperature-sensitive portions 30), and the like. Here, as for the sensitivity variation, it is possible to detect variation in sensitivity in the respective pixel portions 2, and for example, variation in sensitivity resulting from warpage of the first thin-film structural portion 3a, sticking of the first thin-film structural portion 3a to the semiconductor substrate 1, and the like can be detected. Here, in the infrared sensor chip 100 of this embodiment, the fault diagnosis wire 139 has such a shape that the wire meanders by being folded in the vicinity of a gathering position of multiple hot junctions T1 in a plan view. Thus, it is possible to efficiently heat up the respective hot junctions T1 with the Joule heat generated when current flows into the fault diagnosis wire 139. The fault diagnosis wires 139 are formed in the same thickness on the same plane as the n-type polysilicon layer 34 and the p-type polysilicon layer 35.

The infrared absorbing layer 39 and the fault diagnosis wire 139 contain the same n-type impurities (for example, phosphorus or the like) in the same impurity concentration (for example, $10^{18}$ cm$^{-3}$ to $10^{20}$ cm$^{-3}$) as the n-type polysilicon layer 34 and are formed simultaneously with the n-type polysilicon layer 34. For example, boron may be used as the p-type impurities of the p-type polysilicon layer 35, and an impurity concentration may be appropriately set in a range of approximately $10^{18}$ cm$^{-3}$ to $10^{20}$ cm$^{-3}$. In this embodiment, since the n-type polysilicon layer 34 and the p-type polysilicon layer 35 have an impurity concentration of $10^{18}$ cm$^{-3}$ to $10^{20}$ cm$^{-3}$, it is possible to reduce the resistance value of the thermocouple and to improve the S/N ratio. In this embodiment, the infrared absorbing layer 39 and the fault diagnosis wire 139 are doped with the same n-type impurities in the same impurity concentration as the n-type polysilicon layer 34, but the present invention is not limited to this. For example, the infrared absorbing layer 39 and the fault diagnosis wire 139 may be doped with the same impurities in the same impurity concentration as the p-type polysilicon layer 35. In short, the fault diagnosis wire (self-diagnosis wire) 139 is preferably formed of the same material as the n-type polysilicon layer 34 which is a first thermoelectric element or the p-type polysilicon layer 35 which is a second thermoelectric element.

By the way, in this embodiment, when the refractive index of each of the n-type polysilicon layer 34, the p-type polysilicon layer 35, the infrared absorbing layer 39, and the fault diagnosis wire 139 is $n_1$, and the central wavelength of the infrared rays to be detected is λ, the thickness t1 of each of the n-type polysilicon layer 34, the p-type polysilicon layer 35, the infrared absorbing layer 39, and the fault diagnosis wire 139 is set to $\lambda/4n_1$. Therefore, it is possible to increase absorption efficiency of infrared rays having a detection target wavelength (for example, 8 μm to 12 μm) and to obtain high sensitivity. For example, when $n_1$=3.6 and λ=10 μm, the thickness may be set to be t1≈0.69 μm.

Further, in this embodiment, since the impurity concentration of each of the n-type polysilicon layer 34, the p-type polysilicon layer 35, the infrared absorbing layer 39, and the fault diagnosis wire 139 is $10^{18}$ cm$^{-3}$ to $10^{20}$ cm$^{-3}$, it is possible to suppress reflection of infrared rays while increasing an absorption ratio of infrared rays and to increase the S/N ratio of the output of the temperature-sensitive portion 30. Furthermore, since the infrared absorbing layer 39 and the fault diagnosis wire 139 can be formed in the same step with the n-type polysilicon layer 34, it is possible to decrease the cost.

Here, the connecting portion 36 and the connecting portion 37 of the temperature-sensitive portion 30 are divided to be insulated by the interlayer insulating film 50 on the one surface side of the semiconductor substrate 1. And then, the connecting portion 36 of the hot junction T1 is electrically connected to the respective one end portions of both polysilicon layers (34, 35) (the first end portion of the n-type polysilicon layer 34 and the first end portion of the p-type polysilicon layer 35) through contact holes ($50a_1$, $50a_2$) that are formed in the interlayer insulating film 50 (see FIG. 10). Moreover, the connecting portion 37 of the cold junction T2 is electrically connected to the respective the other end portions of both polysilicon layers (34, 35) (the second end portion of the n-type polysilicon layer 34 and the second end portion of the p-type polysilicon layer 35) through contact holes ($50a_3$, $50a_4$) that are formed in the interlayer insulating film 50 (see FIG. 9).

In this instance, the MOS transistor 4 is formed in the formation region A2 for the MOS transistor 4 on the one surface side of the semiconductor substrate 1 as described above (see FIG. 5).

Figure 12:
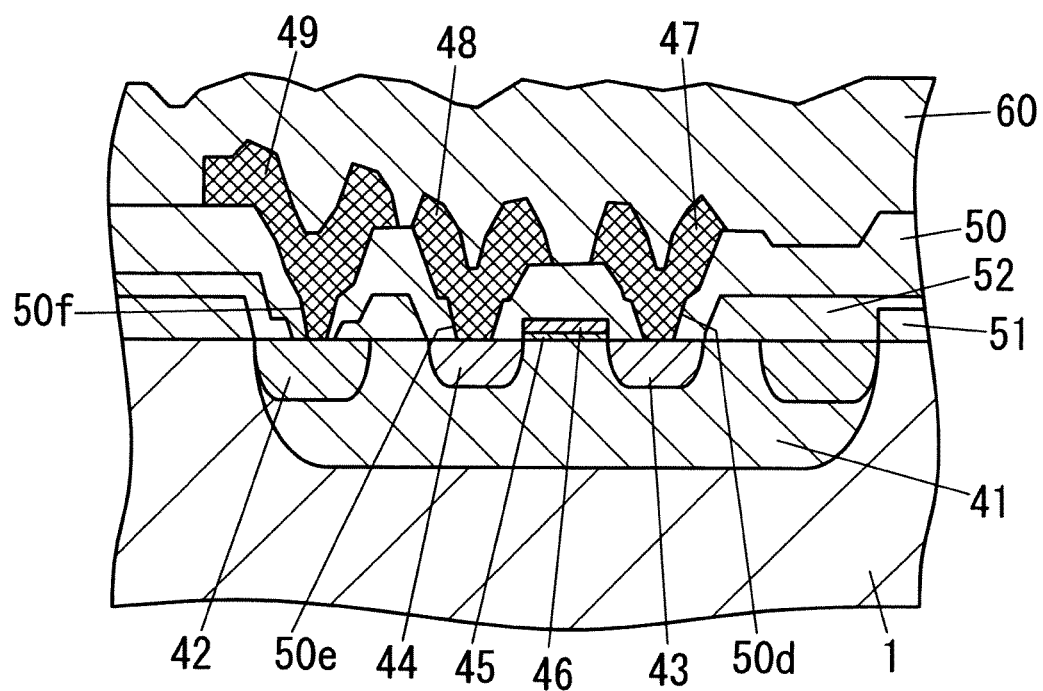
FIG. 12 is a schematic cross-sectional view showing a main part of the pixel portion of the infrared sensor chip in the first embodiment.

As shown in FIGS. 5 and 12, in the MOS transistor 4, a $p^+$-type well region 41 is formed on the one surface side (front surface side) of the semiconductor substrate 1, and an $n^+$-type drain region 43 and an $n^+$-type source region 44 are formed within the $p^+$-type well region 41 so as to be spaced from each other. Further, a $p^{++}$-type channel stopper region 42 is formed within the $p^+$-type well region 41 so as to surround the $n^+$-type drain region 43 and the $n^+$-type source region 44.

The gate electrode 46 formed of a n-type polysilicon layer is formed on a portion of the $p^+$-type well region 41 between the $n^+$-type drain region 43 and the $n^+$-type source region 44 via a gate insulating film 45 formed of a silicon dioxide film (thermally-oxidized film) interposed.

Further, the drain electrode 47 formed of a metal material (for example, Al—Si or the like) is formed on the $n^+$-type drain region 43. The source electrode 48 formed of a metal material (for example, Al—Si or the like) is formed on the $n^+$-type source region 44.

The gate electrode 46, the drain electrode 47, and the source electrode 48 are divided to be insulated by the interlayer insulating film 50 described above. The drain electrode 47 is electrically connected to the $n^+$-type drain region 43 through a contact hole 50d that is formed in the interlayer insulating film 50. The source electrode 48 is electrically connected to the $n^+$-type source region 44 through a contact hole 50e that is formed in the interlayer insulating film 50.

In each pixel portions 2 of the infrared sensor chip 100, the source electrode 48 of the MOS transistor 4 is electrically connected to one end of the temperature-sensitive portion 30, and the other end of the temperature-sensitive portion 30 is electrically connected to the reference bias line 5. In each pixel portions 2, the drain electrode 47 of the MOS transistor 4 is electrically connected to the vertical read line 7 and the gate electrode 46 is electrically connected to the horizontal signal line 6. Herein, the horizontal signal line 6 is formed of an n-type polysilicon wire and is formed to be continuous to and integrated with the gate electrode 46. Further, in each pixel portions 2, an electrode for grounding (hereinafter referred to as a ground electrode) 49 formed of a metal material (for example, Al—Si or the like) is formed on the $p^{++}$-type channel stopper region 42 of the MOS transistor 4. The ground electrode 49 is electrically connected to the common ground line 8 so as to bias the $p^{++}$-type channel stopper region 42 into a lower potential than the $n^+$-type drain region 43 and the $n^+$-type source region 44 to realize device separation. The ground electrode 49 is electrically connected to the $p^{++}$-type channel stopper region 42 through a contact hole 50f that is formed in the interlayer insulating film 50.

According to the infrared sensor chip 100 described above, since the chip includes the self-diagnosis wire 139 that heats up the hot junction T1 using the generated Joule heat when flowing a current through the wire, it is possible to determine the presence of fault such as disconnection of the thermopile 30a by allowing current to flow into the self-diagnosis wire 139 to measure the output of the thermopile 30a. Therefore, it is possible to improve reliability. Further, since the self-diagnosis wire 139 is disposed in a region of the thermal infrared detector 3 that overlaps the cavity portion 11 of the semiconductor substrate 1 but does not overlap the thermopile 30a, it is possible to prevent an increase of the heat capacity of the hot junction T1 of the thermopile 30a due to the self-diagnosis wire 139 and to improve sensitivity and a response speed.

Here, in the infrared sensor chip 100, since the self-diagnosis wire 139 also absorbs infrared rays from the outside in a normal time of the usage where self-diagnosis is not performed, it is possible to equalize the temperature of a plurality of hot junctions T1 and to improve sensitivity. In the infrared sensor chip 100, since the infrared absorbing layer 39 and the reinforcing layer 39b also absorb infrared rays from the outside, it is possible to equalize the temperature of a plurality of hot junctions T1 and to improve sensitivity. In this embodiment, the self-diagnosis of the infrared sensor chip 100 is performed periodically during the usage by a self-diagnosis circuit (not shown) that is provided in the IC chip 102, but the self-diagnosis may not be always performed periodically.

Moreover, in the infrared sensor chip 100, the first thin-film structural portions 3a is divided into a plurality of second thin-film structural portions 3aa by the plurality of slits 13, wherein the second thin-film structural portions 3aa are arranged along the inner circumferential direction of the cavity portion 11 and each of the second thin-film structural portions 3aa extends inward from the supporting portion 3d which is a portion of the thermal infrared detector 3 surrounding the cavity portion 11. In addition, the hot junction T1 of the thermopile 30a is provided in each of the second thin-film structural portions 3aa. Further, all thermopiles 30a are electrically connected in such a connection relationship that a change in the output according to a change in temperature becomes larger as compared to a case where the output is taken from each of the thermopiles 30a. Thus, it is possible to improve a response speed and sensitivity. Furthermore, since the self-diagnosis wire 139 is formed so as to extend over all of the second thin-film structural portions 3aa, it is possible to self-diagnose all thermopiles 30a of the thermal infrared detectors 3 in a lump. Further, in the infrared sensor chip 100, since the connecting piece 3c that connects the adjacent second thin-film structural portions 3aa is formed, it is possible to suppress warpage of the respective second thin-film structural portions 3aa, to improve structural stability, and to stabilize sensitivity.

Moreover, in the infrared sensor chip 100, since the n-type polysilicon layer 34, the p-type polysilicon layer 35, the infrared absorbing layer 39, the reinforcing layer 39b, and the self-diagnosis wire 139 have the same thickness, it is possible to improve uniformity of the stress balance of the second thin-film structural portion 3aa, to suppress warpage of the second thin-film structural portion 3aa, and to reduce variation in the sensitivity among individual products and variation in the sensitivity among the respective pixel portions 2.

Further, in the infrared sensor chip 100, since the self-diagnosis wire 139 is formed of the same material as the n-type polysilicon layer 34 which is a first thermoelectric element or the p-type polysilicon layer 35 which is a second thermistor, it is possible to form the self-diagnosis wire 139 simultaneously with the first thermoelectric element or the second thermoelectric element and to reduce the cost due to a simplified production process.

Moreover, in the infrared sensor chip 100, since a plurality of pixel portions 2 including the infrared absorbing portion 33 and the self-diagnosis wire 139 is provided in an array on the one surface side of the semiconductor substrate 1, by allowing current to flow into the respective self-diagnosis wires 139 of the respective pixel portions 2 when performing self-diagnosis during production or usage, it is possible to detect variation in the sensitivity among the respective temperature-sensitive portions 30 of the respective pixel portions 2.

Further, in the infrared sensor chip 100, since each pixel portions 2 includes the MOS transistor 4 for reading the output of the temperature-sensitive portion 30, it is possible to decrease the number of output pads Vout (see FIG. 14) and to decrease a chip size and the cost.

Hereinafter, a method of producing the infrared sensor chip 100 will be described with reference to FIGS. 15 to 18.

First, an insulating layer forming step is performed to form an insulating layer that is formed of a stacked film of a first silicon dioxide film 31 having a first predetermined thickness (for example, 0.3 µm) and a silicon nitride film 32 having a second predetermined thickness (for example, 0.1 µm) on the one surface side (front surface side) of the semiconductor substrate 1 formed of a silicon substrate. After that, an insulating layer patterning step is performed to etch and remove a portion of the insulating layer corresponding to the formation region A2 for the MOS transistor 4 while leaving a partial portion of the insulating layer corresponding to the formation region A1 for the thermal infrared detector 3 using a photolithography technique and an etching technique. As a result, a structure shown in FIG. 15A is obtained. Here, the first silicon dioxide film 31 is formed by thermally oxidizing the semiconductor substrate 1 at a predetermined temperature (for example, 1100° C.). The silicon nitride film 32 is formed according to an LPCVD method.

After the insulating layer patterning step, a well region forming step is performed to form the p$^+$-type well region 41 on the one surface side of the semiconductor substrate 1. Subsequently, a channel stopper region forming step is performed to form the p$^{++}$-type channel stopper region 42 within the p$^+$-type well region 41 on the one surface side of the semiconductor substrate 1. As a result, a structure shown in FIG. 15B is obtained. In the well region forming step, first, an exposed portion on the one surface side of the semiconductor substrate 1 is thermally oxidized at a predetermined temperature to form a second silicon dioxide film (thermally-oxidized film) 51 selectively. After that, the silicon dioxide film 51 is patterned using a photolithography technique and an etching technique that use a mask for forming the p$^+$-type well region 41. Subsequently, ion implantation of p-type impurities (for example, boron or the like) is performed, followed by a drive-in to thereby form the p$^+$-type well region 41. In the channel stopper region forming step, the one surface side of the semiconductor substrate 1 is thermally oxidized at a predetermined temperature to form a third silicon dioxide film (thermally-oxidized film) 52 selectively. After that, the third silicon dioxide film 52 is patterned using a photolithography technique and an etching technique that use a mask for forming the p$^{++}$-type channel stopper region 42. Subsequently, ion implantation of p-type impurities (for example, boron or the like) is performed, followed by a drive-in to thereby form the p$^{++}$-type channel stopper region 42. The first silicon dioxide film 31, the second silicon dioxide film 51, and the third silicon dioxide film 52 form the silicon dioxide film 1b on the one surface side of the semiconductor substrate 1.

After the channel stopper region forming step described above, a source and drain forming step is performed to form the n$^+$-type drain region 43 and the n$^+$-type source region 44. In the source and drain forming step, ion implantation of n-type impurities (for example, phosphorus or the like) is performed on regions of the p$^+$-type well region 41 where the n$^+$-type drain region 43 and the n$^+$-type source region 44 are to be formed, followed by a drive-in to thereby form the n$^+$-type drain region 43 and the n$^+$-type source region 44.

After the source and drain forming step, a gate insulating film forming step is performed to form a gate insulating film 45 formed of a silicon dioxide film (thermally-oxidized film) having a predetermined thickness (for example, 600 Å) by thermally oxidizing the one surface side of the semiconductor substrate 1. Subsequently, a polysilicon layer forming step is performed in which an LPCVD method is used to form a non-doped polysilicon layer having a predetermined thickness (for example, 0.69 µm) on the entire surface on the one surface side of the semiconductor substrate 1, the non-doped polysilicon layer serving as a base of the gate electrode 46, the horizontal signal line 6 (see FIG. 3), the n-type polysilicon layer 34, the p-type polysilicon layer 35, the infrared absorbing layer 39, and the fault diagnosis wire 139. After that, a polysilicon layer patterning step is performed to pattern the non-doped polysilicon layer using a photolithography technique and an etching technique so that portions of the non-doped polysilicon layer corresponding to the gate electrode 46, the horizontal signal line 6, the n-type polysilicon layer 34, the p-type polysilicon layer 35, the infrared absorbing layer 39, and the fault diagnosis wire 139 are left. Subsequently, a p-type polysilicon layer forming step is performed to form the p-type polysilicon layer 35 by performing ion implantation of p-type impurities (for example, boron or the like) on a portion of the non-doped polysilicon layer corresponding to the p-type polysilicon layer 35, followed by a drive-in. After that, a n-type polysilicon layer forming step is performed to form the n-type polysilicon layer 34, the infrared absorbing layer 39, the fault diagnosis wire 139, the gate electrode 46, and the horizontal signal line 6 by performing ion implantation of n-type impurities (for example, phosphorus or the like) on portions of the non-doped polysilicon layer corresponding to the n-type polysilicon layer 34, the infrared absorbing layer 39, the fault diagnosis wire 139, the gate electrode 46, and the horizontal signal line 6, followed by a drive-in. As a result, a structure shown in FIG. 16A is obtained. The order of the p-type polysilicon layer forming step and the n-type polysilicon layer forming step may be reversed.

After the p-type polysilicon layer forming step and the n-type polysilicon layer forming step, an interlayer insulating film forming step is performed to form the interlayer insulating film 50 on the one surface side of the semiconductor substrate 1. Subsequently, a contact hole forming step is performed to form the respective contact holes ($50a_1$, $50a_2$, $50a_3$, $50a_4$, $50d$, $50e$, and $50f$) (see FIGS. 9, 10, and 12) in the interlayer insulating film 50 using a photolithography technique and an etching technique. As a result, a structure shown in FIG. 16B is obtained. In the interlayer insulating film forming step, a BPSG film having a predetermined thickness (for example, 0.8 µm) is deposited on the one surface side of the semiconductor substrate 1 according to a CVD method, and a reflow process is performed at a predetermined temperature (for example, 800° C.) to form a planarized interlayer insulating film 50.

After the contact hole forming step described above, a metal film forming step is performed to form a metal film (for example, an Al—Si film) having a predetermined thickness (for example, 2 µm) on the entire surface on the one surface side of the semiconductor substrate 1 according to a sputtering method, the metal film serving as a base of the connecting portions (36, 37), the drain electrode 47, the source electrode 48, the reference bias line 5, the vertical read line 7, the ground line 8, the common ground line 9, and the respective pads (Vout, Vsel, Vref, Vdd, Gnd, and the like) (see FIG. 14). Subsequently, a metal film patterning step is performed to form the connecting portions (36, 37), the drain electrode 47, the source electrode 48, the reference bias line 5, the vertical read line 7, the ground line 8, the common ground line 9, and the respective pads (Vout, Vsel, Vref, Vdd, Gnd, and the like) by patterning the metal film using a photolithography technique and an etching technique. As a result, a structure shown in FIG. 17A is obtained. In the metal film patterning step, the etching is performed according to RIE. Moreover, by performing the metal film patterning step, the hot junction T1 and the cold junction T2 are formed.

After the metal film patterning step, a passivation film forming step is performed in which a CVD method is used to form the passivation film 60 on the one surface side (that is, the front surface side of the interlayer insulating film 50) of the semiconductor substrate 1, the passivation film 60 formed of a stacked film of a PSG film having a predetermined thickness (for example, 0.5 µm) and a NSG film having a predetermined thickness (for example, 0.5 µm). As a result, a structure shown in FIG. 17B is obtained.

After the passivation film forming step described above, a stacked structural portion patterning step is performed to form the second thin-film structural portion 3aa and the connecting piece 3c by patterning a stacked structural portion which includes the silicon dioxide film 31, the silicon nitride film 32, the interlayer insulating film 50, the passivation film 60, and the like and in which the temperature-sensitive portion 30 and the like are embedded. As a result, a structure shown in FIG. 18A is obtained. In the stacked structural portion patterning step, the respective slits (13, 14) are formed.

After the stacked structural portion patterning step described above, an opening forming step is performed to form an opening portion (not shown), through which the respective pads (Vout, Vsel, Vref, Vdd, and Gnd) are exposed, using a photolithography technique and an etching technique. Subsequently, a cavity portion forming step is performed to form the cavity portion 11 in the semiconductor substrate 1 by anisotropically etching (by performing crystal anisotropic etching on) the semiconductor substrate 1 with an etching solution introduced through the respective slits (13, 14) as an etching solution introduction hole. As a result, the infrared sensor chip 100 having a structure shown in FIG. 18B is obtained. Here, in the opening forming step, the etching is performed according to RIE. In the cavity portion forming step, a TMAH solution heated to a predetermined temperature (for example, 85° C.) is used as an etching solution, but the etching solution is not limited to the TMAH solution and another alkaline solution (for example, a KOH solution or the like) may be used. All steps up to the end of the cavity portion forming step are performed on the wafer level, and a separation step is performed to separate the infrared sensor chip 100 into individual infrared sensor chips 100 after the cavity portion forming step. Moreover, as can be understood from the above description, the method of manufacturing the MOS transistor 4 employs a well-known typical MOS transistor manufacturing method, and the $p^+$-type well region 41, the $p^{++}$-type channel stopper region 42, the $n^+$-type drain region 43, and the $n^+$-type source region 44 are formed by repeatedly performing basic steps including forming of a thermally-oxidized film according to thermal oxidation, patterning of the thermally-oxidized film according to a photolithography technique and an etching technique, ion implantation of impurities and drive-in (diffusion of impurities).

In the infrared sensor chip 100 described above, a single-crystalline silicon substrate in which the (100) plane is the one surface is used as the semiconductor substrate 1, and the cavity portion 11 that is formed according to anisotropic etching utilizing crystal orientation dependence of an etching rate has a square pyramidal shape, but the shape of the cavity portion 11 is not limited to the square pyramidal shape but may be a truncated square pyramidal shape. Moreover, the orientation of the one surface of the semiconductor substrate 1 is not particularly limited, and for example, a single-crystalline silicon substrate in which the (110) plane is the one surface may be used as the semiconductor substrate 1.

The IC chip 102 is an application specific IC (ASIC) and is formed using a silicon substrate.

For example, the IC chip 102 includes: a control circuit that controls the infrared sensor chip 100, an amplification circuit that amplifies the output voltages of a plurality of input pads that is electrically connected to the plurality of output pads 80 of the infrared sensor chip 100, a multiplexer that selectively inputs the output voltages of the plurality of input pads to the amplification circuit, an arithmetic circuit that calculates a temperature based on the output of the amplification circuit (the output corresponding to a temperature difference between the hot junction T1 and the cold junction T2 of the pixel portion 2) and the output of the thermistor 101 (the output corresponding to the absolute temperature, which is assumed to be the output corresponding to the temperature of the cold junction T2 of the pixel portion 2), and the like. The IC chip 102 can display an infrared image on an external display device. Moreover, the IC chip 102 also includes the self-diagnosis circuit described above. A circuit configuration of the IC chip 102 is not particularly limited. Further, the thermistor 101 may not be always provided.

In the infrared sensor of this embodiment, an inner space (hermetic space) 165 of the package 103 formed by the package main body 104 and the package cover 105 is maintained in a nitrogen gas (dry nitrogen gas) atmosphere, the atmosphere is not limited to this, and for example, may be a vacuum atmosphere.

In the package main body 104, an electromagnetic shielding layer (not shown) and a wiring pattern (not shown), formed of a metal material, are formed on a base 104a formed of an insulating material. The package main body 104 has an electromagnetic shielding function due to the electromagnetic shielding layer. In the package cover 105, the lens 153 has conductive properties, and the lens 153 is bonded to the metal cap 152 by a conductive material. Thus, the package cover 105 has conductive properties. Moreover, the package cover 105 is electrically connected to the electromagnetic shielding layer of the package main body 104. Therefore, in this embodiment, the electromagnetic shielding layer of the package main body 104 and the package cover 105 can be maintained at the same potential. As a result, the package 103 has an electromagnetic shielding function of preventing exogenous electromagnetic noise from entering a sensor circuit (not shown) that includes the infrared sensor chip 100, the IC chip 102, the thermistor 101, the wiring pattern, a bonding wire (not shown) described later, and the like.

The package main body 104 is formed of a planar ceramic substrate in which the infrared sensor chip 100, the IC chip 102, and the thermistor 101 are mounted on one surface side (front surface side). That is, in the package main body 104, the base 104a is formed of a ceramics which is an insulating material, and pads (not shown) of the infrared sensor chip 100 and the IC chip 102 are appropriately connected to a portion of the wiring pattern that is formed on the one surface side (front surface side) of the base 104a via a bonding wire. In the infrared sensor, the infrared sensor chip 100 and the IC chip 102 are electrically connected via a bonding wire and the wiring pattern of the package main body 104 and the like. As the bonding wires, it is preferable to use Au wires having better corrosion resistance than Al wires.

In this embodiment, since ceramics is used as the insulating material of the package main body 104, it is possible to improve moisture resistance and heat resistance of the package main body 104 as compared to when an organic material such as an epoxy resin is used as the insulating material. Here, alumina is used as the ceramics which is the insulating material, but the ceramics is not particularly limited to alumina, and an aluminum nitride, a silicon carbide, or the like may be used. A thermal conductivity of alumina is approximately 14 W/m·K.

Further, in the package main body 104, an external connection electrode (not shown) consisting of a part of the wiring pattern described above is formed so as to extend over the other surface (rear surface) and the side surface of the base 104a. Therefore, in the infrared sensor of this embodiment, it is possible to easily conduct a visual examination of a bonding portion bonded to the circuit substrate or the like even after secondary mounting on a circuit substrate or the like.

Moreover, the infrared sensor chip 100 and the IC chip 102 are mounted on the package main body 104 using a die bonding agent. As the die bonding agent, an insulting adhesive agent such as an epoxy-based resin or a silicone-based resin, a conductive adhesive agent such as a solder (a lead-free solder, an Au—Sn solder, or the like) or a silver paste may be used. Further, a room-temperature bonding method, an eutectic bonding method that uses an Au—Sn eutectic crystal or an Au—Si eutectic crystal, and the like may be used instead of using the die bonding agent. A thermal conductivity of an epoxy-based resin is approximately 0.2 W/m·K. Moreover, an outer circumferential shape of the infrared sensor chip 100 and the IC chip 102 is rectangular (square or oblong).

The package cover 105 includes: the metal cap 152 which is formed in a box shape such that one surface closer to the package main body 104 is opened and in which the opening window 152a is formed in a portion corresponding to the infrared sensor chip 100; and the lens 153 that is bonded to the metal cap 152 in such a manner as to block the opening window 152a of the metal cap 152. The package cover 105 is hermetically bonded to the package main body 104 in such a manner that the opened-one surface of the metal cap 152 is blocked by the package main body 104. Here, a metal pattern 147 (see FIG. 1) having a frame shape corresponding to the outer circumferential shape of the package main body 104 is formed along an entire circumferential portion of the one surface (front surface) of the package main body 104. The package cover 105 and the metal pattern 147 of the package main body 104 are metal-bonded according to seam welding (resistance welding method). Thus, it is possible to improve air-tightness and an electromagnetic shielding effect. The metal cap 152 of the package cover 105 is formed of kovar and is coated with a Ni coating. The metal pattern 147 of the package main body 104 is formed of kovar and is coated with a Ni coating and an Au coating. A thermal conductivity of kovar is approximately 16.7 W/m·K.

A method of bonding the package cover 105 and the metal pattern 147 of the package main body 104 is not limited to seal welding, and other welding methods (for example, a spot welding method) and a conductive resin may be used. In an anisotropic conductive adhesive, content of conductive particles dispersed in a resin (binder) is small, and the thickness of a bonding portion between the package cover 105 and the package main body 104 can be decreased by performing heating and pressing during bonding. Thus, when the anisotropic conductive adhesive agent is used as the conductive resin, it is possible to suppress moisture and gas (for example, water vapor, oxygen, or the like) from entering into the package 103 from the outside. Moreover, one in which a drying agent such as a barium oxide or a calcium oxide is mixed may be used as a conductive resin.

In this embodiment, the outer circumferential shape of the package main body 104 and the package cover 105 is rectangular, but the shape is not limited to a rectangular shape and may be a circular shape, for example. Moreover, the metal cap 152 of the package cover 105 includes a flange portion 152b that is formed so as to extend outward from an edge closer to the package main body 104 over the entire circumference, and the flange portion 152b is bonded to the package main body 104 over the entire circumference. That is, by bonding the flange portion 152b to the metal pattern 147, the package cover 105 is bonded to the package main body 104.

The lens 153 is a planoconvex aspherical lens. Therefore, in the infrared sensor of this embodiment, it is possible to obtain high sensitivity due to an improvement in the infrared ray reception efficiency of the infrared sensor chip 100 while making the lens 153 thinner. Moreover, in the infrared sensor of this embodiment, a detection area of the infrared sensor chip 100 can be set by the lens 153. The lens 153 is formed using a semiconductor substrate different from the semiconductor substrate 1 of the infrared sensor chip 100. Specifically, the lens 153 is formed of a semiconductor lens (in this example, a silicon lens). The semiconductor lens is obtained by forming an anode in which a contact pattern with a semiconductor substrate (in this example, a silicon substrate) is designed according to a desired lens shape on an one surface side of the semiconductor substrate so that the contact with the semiconductor substrate becomes an ohmic contact, anodically oxidizing the other surface side of the semiconductor substrate in an electrolytic solution made from a solution that etches and removes oxides of the constituent elements of the semiconductor substrate to form a porous portion as a removing portion, and removing the porous portion. Therefore, the lens 153 has conductive properties. A semiconductor lens production method that uses this kind of anodic oxidation technique is disclosed, for example, in Japanese Patent Nos. 3897055, 3897056, and the like, and description thereof will not be provided.

In this embodiment, since the detection area of the infrared sensor chip 100 can be set by the lens 153 formed of the semiconductor lens described above, and a semiconductor lens having a shorter focal length, a larger lens aperture, and a smaller lens aberration than a spherical lens can be used as the lens 153, it is possible to make the package 103 thinner due to the short focal length. The infrared sensor of this embodiment uses infrared rays in a wavelength range (8 µm to 13 µm) around 10 µm radiated by the human body as the infrared rays that are be detected by the infrared sensor chip 100, and Si which has a smaller environmental burden than ZnS, GaAs, and the like, is less expensive than Ge, and has small wavelength dispersion than ZnS is used as a material of the lens 153.

Moreover, the lens 153 is fixed to the circumferential portion of the opening portion 152a of the metal cap 152 by a bonding portion (not shown) formed of a conductive adhesive agent (for example, a lead-free solder, a silver paste, or the like). When a conductive adhesive agent is used as a material of the bonding portion, since the lens 153 is electrically connected to the electromagnetic shielding layer of the package main body 104 via the bonding portion and the metal cap 152, it is possible to improve electromagnetic noise shielding properties and to prevent a decrease of the S/N ratio resulting from exogenous electromagnetic noise.

In the lens 153 described above, it is preferable to provide a filter portion (not shown) formed of an optical multi-layered film (multi-layered interference filter film) that transmits infrared rays in a desired wavelength range including the wavelength of infrared rays to be detected by the infrared sensor chip 100 and reflects infrared rays outside the wavelength range. By forming such a filter portion, it is possible to block unnecessary infrared rays and visible rays in a wavelength range outside a desired wavelength range using the filter portion, to suppress occurrence of noise due to sunlight, and to obtain high sensitivity.

Here, in this embodiment, as described above, since a bare chip is used as the IC chip 102, by appropriately selecting materials of the metal cap 152, the lens 153, and the filter portion so that the package cover 105 has a function of blocking visible rays, it is possible to prevent a malfunction of the IC chip 102 resulting from electromotive force caused by visible rays. Note that, when the IC chip 102 formed of a bare chip is provided with a resin portion (not shown) for blocking light from the outside on at least one surface thereof which is closer to the package cover 105, it is possible to prevent a malfunction of the IC chip 102 resulting from electromotive force caused by visible rays.

Moreover, in this embodiment, since the package main body 104 is formed in a planar form, it is possible to easily mount the infrared sensor chip 100 and the IC chip 102 on the package main body 104 and to reduce the cost of the package main body 104. Further, since the package main body 104 is formed in a planar form, it is possible to improve the accuracy of the distance between the infrared sensor chip 100 and the lens 153 that are disposed on the one surface side of the package main body 104 as compared to a case where the package main body 104 is formed of a multi-layered ceramic substrate in such a box shape that one surface is opened, and the infrared sensor chip 100 is mounted on an inner bottom surface of the package main body 104. That is, it is possible to obtain further higher sensitivity.

The cover member 106 is composed of: the front plate portion 107 which is located on a front side of the infrared sensor chip 100 and in which the window hole 108 is formed; and the side plate portion 109 that is extended toward the rear side from the outer circumferential edge of the front plate portion 107 and is bonded to the package main body 104 between the IC chip 102 and the infrared sensor chip 100. Here, the front plate portion 107 is disposed between the lens 153 and the infrared sensor chip 100 so as to be spaced from the lens 153 and spaced from the infrared sensor chip 100. The cover member 106 is disposed so that the window hole 108 is positioned between the infrared sensor chip 100 and the lens 153 (a portion of the package cover 105 that has a function of transmitting infrared rays to be detected). Moreover, the front plate portion 107 of the cover member 106 is spaced from the package 103. In this embodiment, the side plate portion 109 is disposed between the IC chip 102 and the infrared sensor chip 100 so as to be spaced from the IC chip 102 and the infrared sensor chip 100, and it is more preferable that the distance between the side plate portion 109 and the IC chip 102 is smaller than the distance between the side plate portion 109 and the infrared sensor chip 100. In short, it is preferable to dispose the side plate portion 109 in proximity to the IC chip 102. In this embodiment, the cover member 106 is disposed in proximity to both the infrared sensor chip 100 and the IC chip 102. Thus, the heat of the IC chip 102 is transferred to the programmer 104 and the cover member 106. In short, the heat of the IC chip 102 is transferred to the infrared sensor chip 100 along a path through the package main body 104 and a path through the cover member 106.

Kovar is used as a material of the cover member 106, but the material is not limited to this, and for example, stainless steel, copper, aluminum, or the like may be used. In this embodiment, the cover member 106 is formed of a material having conductive properties. When the cover member 106 is formed of a conductive material, it is possible to impart electromagnetic shielding properties to the cover member 106. Thus, it is possible to reduce propagation of electromagnetic noise from the IC chip 102 to the infrared sensor chip 100.

In the cover member 106 described above, the outer circumferential shape of the front plate portion 107 is rectangular, and an external size of the front plate portion 107 is set such that the infrared sensor chip 100 is included in a projection region of the outer circumferential edge of the front plate portion 107. The side plate portion 109 of the cover member 106 and the package main body 104 can be bonded, for example, by an adhesive agent (for example, an epoxy resin or the like). From a viewpoint of thermally coupling the cover member 106 and the package main body 104, the adhesive agent is preferred to have high thermal conductivity. Moreover, a material having conductive properties is preferred from a viewpoint of electrically connecting the cover member 106 to the shielding layer of the package main body 104 to impart electromagnetic shielding properties. It is preferable to use a silver paste or the like as the adhesive agent, for example. The window hole 108 of the front plate portion 107 is opened in a rectangular shape. Here, the opening shape of the window hole 108 is set to be similar to the outer circumferential shape of the infrared sensor chip 100, but the two shapes may not be always similar.

In the infrared sensor of this embodiment described above, since the package 103 is provided therein with the cover member 106 that includes the window hole 108 through which infrared rays pass into the infrared sensor chip 100 and equalizes the amounts of temperature change of the hot junctions T1 and the cold junctions T2 among the pixel portions 2, the temperature change resulting from the heating of the IC chip 102, the heat generated in the IC chip 102 is transferred to the package main body 104 and the cover member 106. That is, in the infrared sensor of this embodiment, the heat resulting from heating of the IC chip 102 is transferred to the pixel portion 2 of the infrared sensor chip 100 through a path through the package main body 104 and a path through the cover member 106. Thus, it is possible to equalize the heat transferred to the respective pixel portions 2 of the infrared sensor chip 100, to suppress variation in the offset voltage in a plane of the infrared sensor chip 100 resulting from the heating of the IC chip 102, and to suppress variation in the S/N ratio. For example, in the infrared sensor shown in FIG. 1, it is possible to reduce a difference between an offset voltage of the temperature-sensitive portion 30 in a pixel portion 2 of the infrared sensor chip 100 closest to the IC chip 102 and an offset voltage of the temperature-sensitive portion 30 in a pixel portion 2 farthest from the IC chip 102, as compared to a case where the cover member 106 is not provided.

Moreover, in the infrared sensor, since the cover member 106 is provided within the package 103, it is possible to prevent infrared rays radiated by the IC chip 102 resulting from heating of the IC chip 102 and infrared rays radiated by the metal cap 152 of the package cover 105 from reaching the infrared sensor chip 100. Here, since the cover member 106 includes the front plate portion 107 which is located on a front side of the infrared sensor chip 100 and in which the window hole 108 is formed and the side plate portion 109 that is extended toward the rear side from the outer circumferential edge of the front plate portion 107 and is bonded to the package main body 104 between the IC chip 102 and the infrared sensor chip 100, it is possible to prevent infrared rays radiated by the IC chip 102 from directly reaching the infrared sensor chip 100.

Moreover, in this embodiment, since the package main body 104 is formed in a planar form, it is possible to easily mount the cover member 106 on the package main body 104.

Further, in this embodiment, the front plate portion 107 is spaced from the package 103. Thus, the front plate portion 107 is not easily affected by a change in the temperature of the package 103 as compared to when the front plate portion 107 is in contact with the package 103.

Moreover, in the infrared sensor of this embodiment, since the MOS transistor 4 is provided in each of the pixel portions 2 of the infrared sensor chip 100, it is possible to reduce noise resulting from a wire disposed between the temperature-sensitive portion 30 and the MOS transistor 4.

Further, in the infrared sensor of this embodiment, since portions of the wiring pattern of the package main body 104 connected to the ground pad (not shown) of each of the infrared sensor chip 100 and the IC chip 102 are electrically connected to the electromagnetic shielding layer, it is possible to reduce the influence of exogenous electromagnetic noise on a sensor circuit that includes the infrared sensor chip 100, the IC chip 102, and the like and to suppress a decrease in the S/N ratio resulting from the exogenous electromagnetic noise. When the infrared sensor is secondarily mounted on a circuit substrate or the like, by electrically connecting the electromagnetic shielding layer to a ground pattern of the circuit substrate or the like, it is possible to reduce the influence of exogenous electromagnetic noise to the above-described sensor circuit and to suppress a decrease in the S/N ratio resulting from exogenous electromagnetic noise.

Second Embodiment

Figure 19:
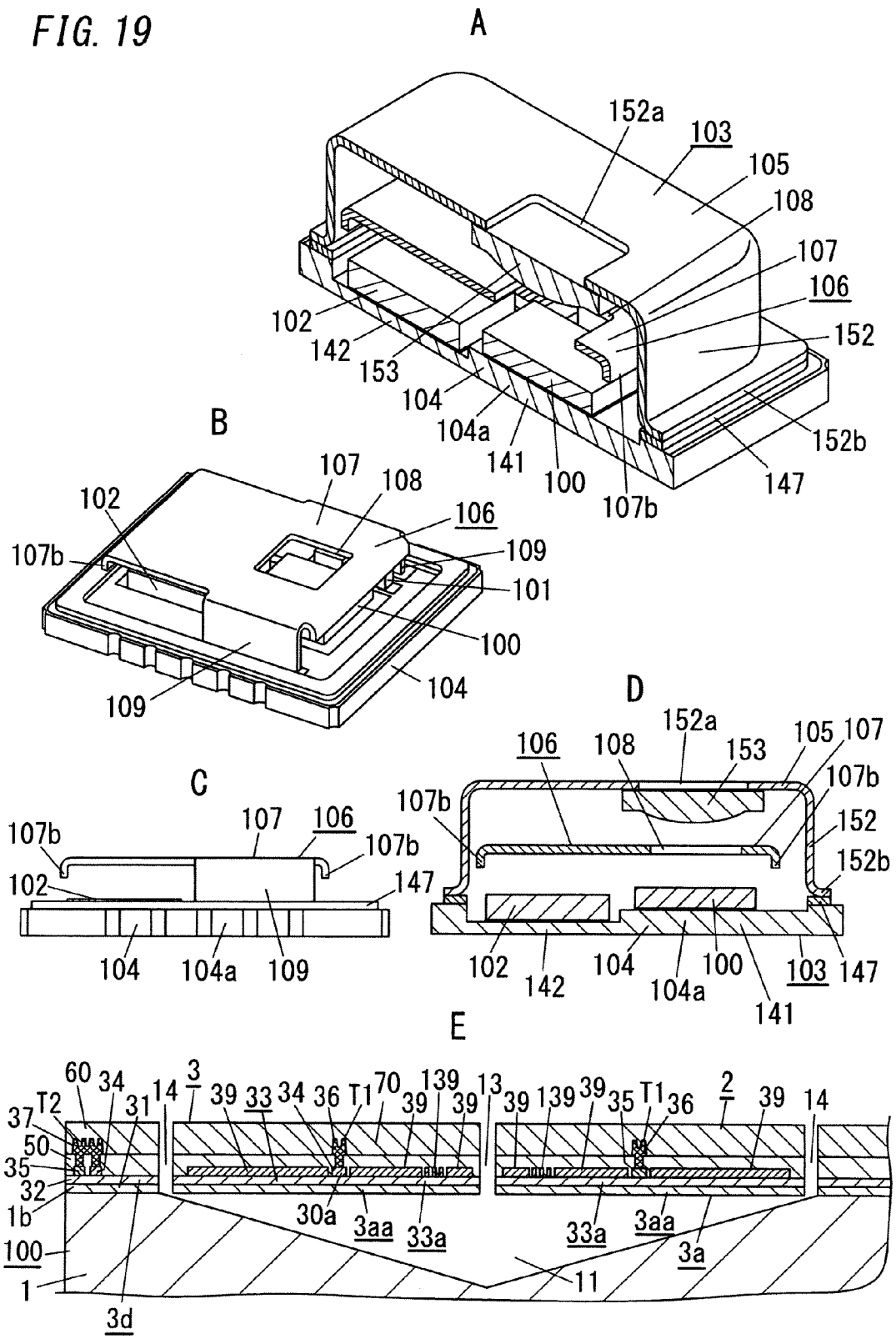

A basic configuration of an infrared sensor of this embodiment is approximately the same as that of the first embodiment, and the shape of the cover member 106 and the like are different as shown in FIG. 19. The same constituent components as those of the first embodiment will be denoted by the same reference signs, and description thereof will not be provided appropriately.

In the package main body 104 of the infrared sensor of this embodiment, a second region 142 on which the IC chip 102 is mounted is more recessed than the surface of the first region 141 on which the infrared sensor chip 100 is mounted. Thus, a step is formed between the surface of the first region 141 and the second region 142. Here, in the package main body 104, a recessing dimension of the second region 142 is set such that a dimension of the step is smaller than a thickness of the IC chip 102.

The cover member 106 includes the front plate portion 107 which is located on a front side of the infrared sensor chip 100 and in which the window hole 108 is formed, and two side plate portions 109 that are extended toward the rear side from the outer circumferential edge of the front plate portion 107 and are bonded to the package main body 104.

Here, a distance between the front plate portion 107 and the infrared sensor chip 100 is set so as to be larger than that of the infrared sensor of the first embodiment. Further, the two side plate portions 109 are positioned on the lateral sides of both side surfaces of the infrared sensor chip 100 along the arrangement direction of the infrared sensor chip 100 and the IC chip 102.

Further, the front plate portion 107 is formed in such a size that the infrared sensor chip 100 and the IC chip 102 are included in a projection region of the outer circumferential line of the front plate portion 107. Moreover, the front plate portion 107 includes a protruding piece 107b that is extended toward the rear side from both side edges in the longitudinal direction (which is a direction along the arrangement direction of the infrared sensor chip 100 and the IC chip 102). A protruding dimension of the protruding piece 107b is set such that a protruding dimension from the front plate portion 107 is smaller than that of the side plate portion 109 and a plane that includes a distal end of the protruding piece 107b is located forward compared to the surface of the infrared sensor chip 100.

In the infrared sensor of this embodiment, it is possible to suppress variation in the S/N ratio in a plane of the infrared sensor chip 100 resulting from heating of the IC chip 102, to bond the cover member 106 more stably than the first embodiment, and to prevent the front plate portion 107 from being tilted in relation to the surface of the infrared sensor chip 100. Further, in the infrared sensor of this embodiment, since the side plate portion 109 is not positioned between the infrared sensor chip 100 and the IC chip 102, the infrared sensor chip 100 and the IC chip 102 can be directly connected by a bonding wire only.

Third Embodiment

Figure 20:
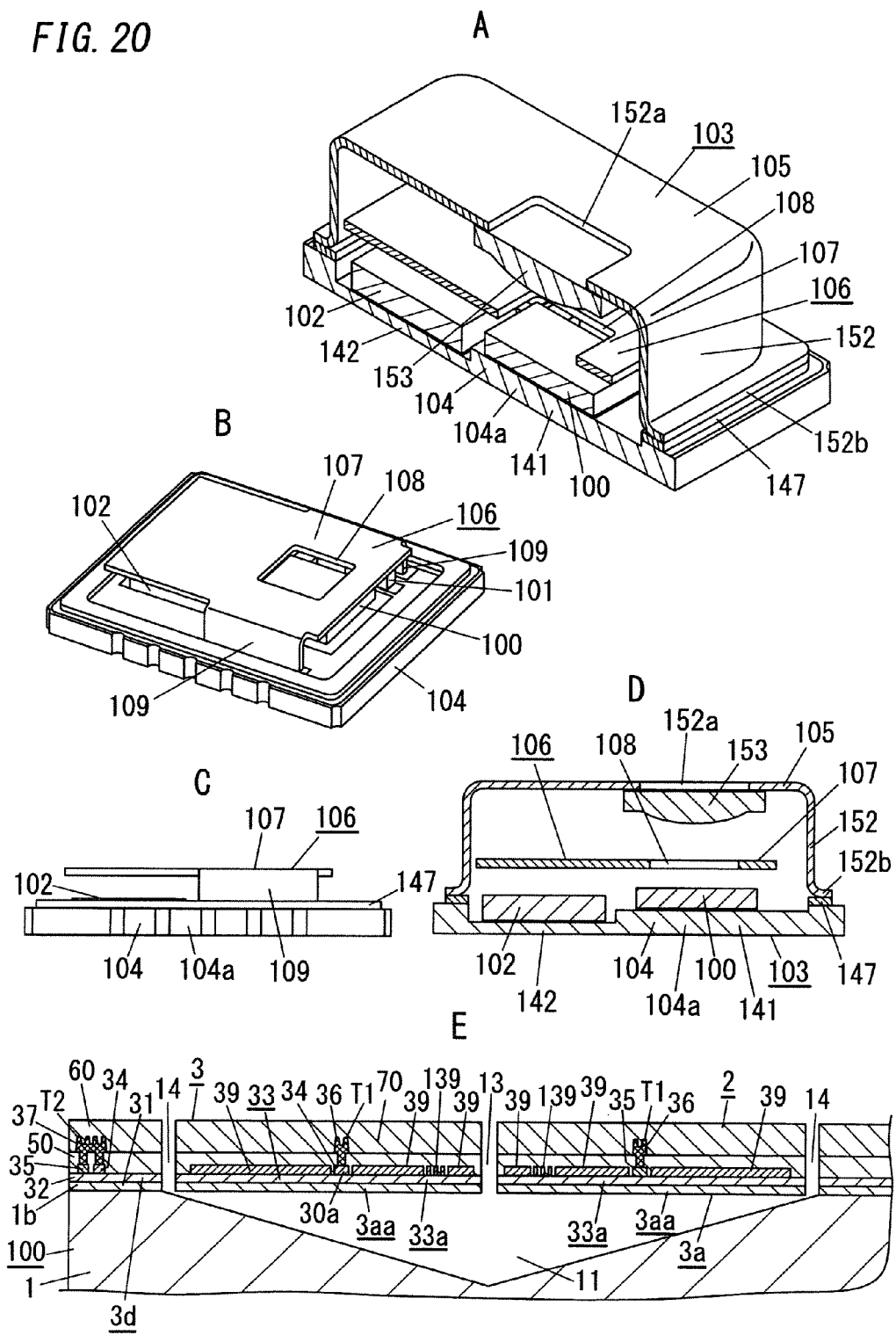

A basic configuration of an infrared sensor of this embodiment is approximately the same as that of the second embodiment, and the shape of the cover member 106 and the like are different as shown in FIG. 20. The same constituent components as those of the second embodiment will be denoted by the same reference signs, and description thereof will not be provided appropriately.

The infrared sensor of this embodiment is different from the infrared sensor of the second embodiment in that the protruding piece 107b (see FIG. 19) described in the second embodiment is not provided, and the distance between the front plate portion 107 and the infrared sensor chip 100 is set to be smaller than that of the infrared sensor of the second embodiment as shown in FIG. 20.

Therefore, in the infrared sensor of this embodiment, it is possible to suppress variation in the S/N ratio in a plane of the infrared sensor chip 100 resulting from heating of the IC chip 102 and to decrease the distance between the front plate portion 107 and the infrared sensor chip 100.

Fourth Embodiment

Figure 21:
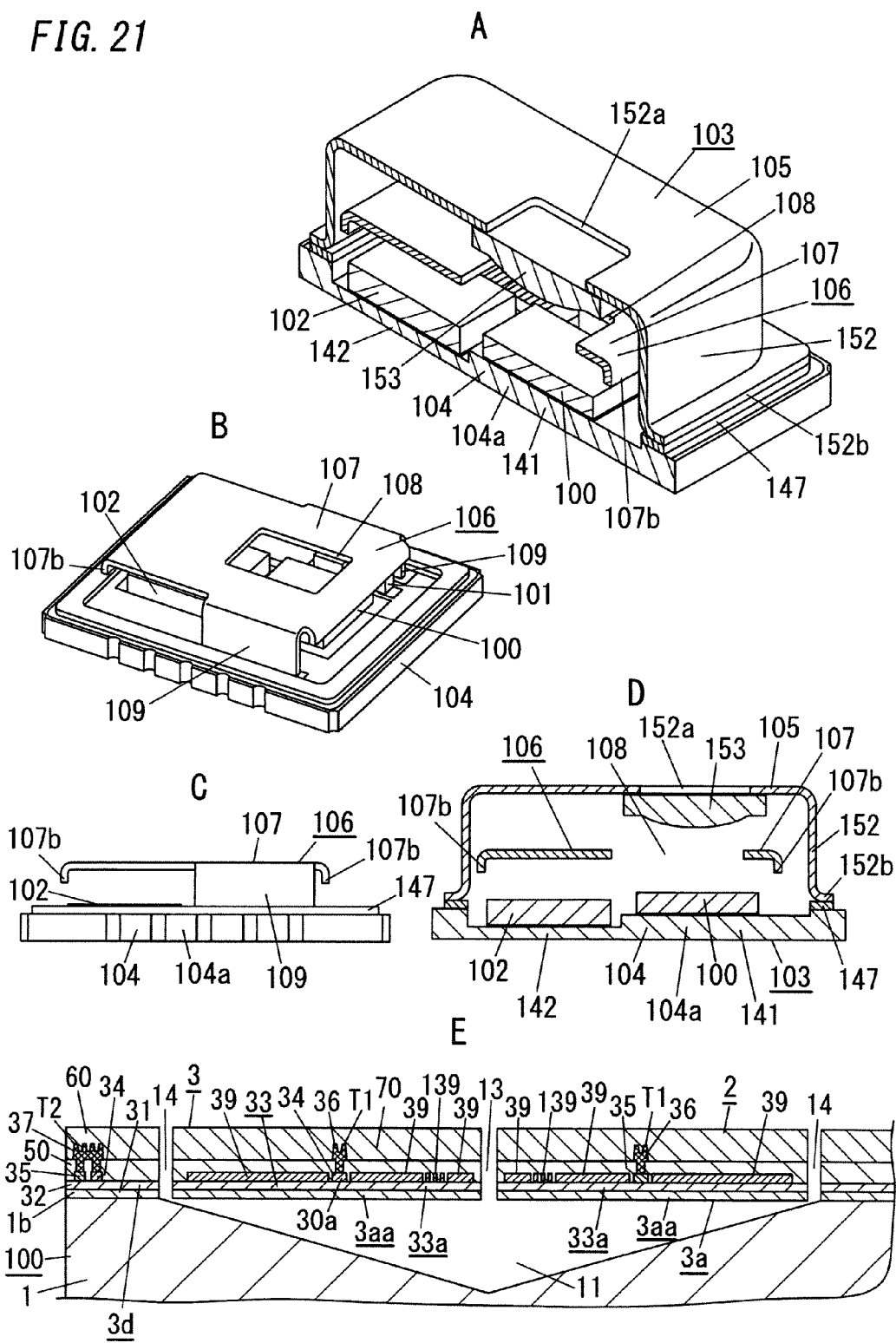

A basic configuration of an infrared sensor of this embodiment is approximately the same as that of the second embodiment, and the shape of the cover member 106 and the like are different as shown in FIG. 21. The same constituent components as those of the second embodiment will be denoted by the same reference signs, and description thereof will not be provided appropriately.

The cover member 106 of this embodiment is the same as that of the second embodiment in that the window hole 108 of the front plate portion 107 has a rectangular shape, but is different from the second embodiment in that an inner circumferential line of the window hole 108 closer to the IC chip 102 (one edge of four edges of the window hole 108, that is one edge on the left side of FIG. 21B) is located closer to the IC chip 102 than an outer circumferential line of the infrared sensor chip 100 (one edge of four edges of the infrared sensor chip 100) closer to the IC chip 102 in a plan view.

Therefore, in the infrared sensor of this embodiment, it is possible to reduce heat transferred to the infrared sensor chip 100 through the cover member 106 as compared to the second embodiment.

By the way, in the respective embodiments, the cavity portion 11 of the semiconductor substrate 1 may be formed in such a manner as to penetrate in the thickness direction of the semiconductor substrate 1. In this case, in a cavity portion forming step of forming the cavity portion 11, a region of the cavity portion 11 is to be formed in the semiconductor substrate 1 by performing etching from the other surface side opposite to the one surface of the semiconductor substrate 1 using an anisotropic etching technique that uses inductively coupled plasma (ICP)-type dry-etching apparatus, for example. Further, in the infrared sensor chip 100, it is sufficient that the plurality of pixel portions 2 that includes the temperature-sensitive portion 30 formed of the thermopile 30a is disposed in an array on the one surface side of the semiconductor substrate 1, and the structure thereof is not particularly limited. The number of thermopiles 30a in a temperature-sensitive portion 30 is not limited to a plural number but may be one. Furthermore, the semiconductor substrate 1 is not limited to the silicon substrate, and may be formed of a germanium substrate, a silicon carbide substrate, or the like, for example. Moreover, in the package cover 104, a planar silicon substrate may be disposed in place of the lens 153 so as to provide a function of transmitting infrared rays. Furthermore, the arrangement of the lens 153 in the package cover 104 is not particularly limited, and the lens 153 may be disposed outside the package cover 104.

While the present invention has been described based on certain preferred embodiments, various changes and modifications can occur to those skilled in the art without departing from the spirit and scope of this invention, that is, the appended claims.

The invention claimed is:

1. An infrared sensor comprising:
an infrared sensor chip in which a plurality of pixel portions is disposed in an array on one surface side of a semiconductor substrate, each of said pixel portions including a temperature-sensitive portion formed of a thermopile;
an IC chip configured to process an output signal of said infrared sensor chip; and
a package in which said infrared sensor chip and said IC chip are accommodated,
wherein said package includes: a package main body having a first region and a second region on which said infrared sensor chip and said IC chip are mounted, respectively, to be arranged side-by-side; and a package cover which is hermetically bonded to said package main body so as to surround said infrared sensor chip and said IC chip together with said package main body, said package cover having a function of transmitting infrared rays to be detected by said infrared sensor chip,
said package is provided therein with a cover member which includes a hole through which infrared rays pass into said infrared sensor chip, said cover member equalizing, among the pixel portions, the amounts of temperature change of hot junctions and cold junctions caused by heating of said IC chip,
said cover member is formed such that both said IC chip and said infrared sensor chip are included within a region of a circumferential line of said cover member in a thickness direction of the IC chip, and
the second region is recessed into the package main body relative to the first region.

2. The infrared sensor according to claim 1, wherein said cover member is configured such that said hole has a rectangular shape, and an inner circumferential line of said hole closer to said IC chip is located closer to said IC chip than an outer circumferential line of said infrared sensor chip closer to said IC chip in a plan view.

3. The infrared sensor according to claim 1, wherein said IC chip is a heat-emitting element.

4. The infrared sensor according to claim 1, wherein said cover member is formed of a conductive material.

5. The infrared sensor according to claim 4, wherein said cover member is bonded to said package main body by a conductive material.

6. The infrared sensor according to claim 1, wherein said cover member includes a front plate portion which is located on a front side of said infrared sensor chip and in which said hole is formed, and a side plate portion which is extended toward a rear side from said front plate portion and is bonded to said package main body.

7. The infrared sensor according to claim 6, wherein said cover member is disposed in proximity to both said infrared sensor chip and said IC chip.

8. The infrared sensor according to claim 6, wherein the front plate portion is formed in such a size that at least said infrared sensor chip is included in a projection region of an outer circumferential line of said front plate portion.

9. An infrared sensor comprising:
an infrared sensor chip in which a plurality of pixel portions is disposed in an array on one surface side of a semiconductor substrate, each of said pixel portions including a temperature-sensitive portion formed of a thermopile; and
a package in which said infrared sensor chip is accommodated, wherein said package includes a package cover which is bonded to said package, said package is provided therein with a heat-emitting element and a cover member, said cover member includes a hole through which infrared rays pass into said infrared sensor chip, said cover member is formed such that both said heat-emitting element and said infrared sensor chip are included in a region of a circumferential line of said cover member in a thickness direction of the heat-emitting element, said package having a first region and a second region on which said infrared sensor chip and said heat-emitting element are mounted, respectively, and the second region is recessed into the package relative to the first region.

10. The infrared sensor according to claim 9, wherein the heat-emitting element is an IC chip configured to process an output signal of said infrared sensor chip.

11. The infrared sensor according to claim 9, wherein said cover member has a function of equalizing, among the pixel portions, the amounts of temperature change of hot junctions and cold junctions caused by heating of said heat-emitting element.

12. The infrared sensor according to claim 9, wherein said package includes a package main body on which said infrared sensor chip and said heat-emitting element are mounted to be arranged side-by-side.

13. The infrared sensor according to claim 9, wherein said package cover is hermetically bonded to said package so as to surround said infrared sensor chip and said heat-emitting element together with said package.

14. The infrared sensor according to claim 9, wherein said package cover has a function of transmitting infrared rays to be detected by said infrared sensor chip.

15. The infrared sensor according to claim 9, wherein said cover member is configured such that said hole has a rectangular shape, and an inner circumferential line of said hole closer to said heat-emitting element is located closer to said heat-emitting element than an outer circumferential line of said infrared sensor chip closer to said heat-emitting element in a plan view.

16. The infrared sensor according to claim 9, wherein said cover member is formed of a conductive material.

17. The infrared sensor according to claim 16, wherein said cover member is bonded to said package by the conductive material.

18. The infrared sensor according to claim 9, wherein said cover member includes a front plate portion which is located on a front side of said infrared sensor chip and in which said hole is formed, and a side plate portion which is extended toward a rear side from said front plate portion and is bonded to said package.

19. The infrared sensor according to claim 18, wherein said cover member is disposed in proximity to both said infrared sensor chip and said heat-emitting element.

20. The infrared sensor according to claim 18, wherein the front plate portion is formed in such a size that at least said infrared sensor chip is included in a projection region of an outer circumferential line of said front plate portion.

* * * * *